US007075954B2

(12) United States Patent
Ledentsov et al.

(10) Patent No.: US 7,075,954 B2
(45) Date of Patent: Jul. 11, 2006

(54) INTELLIGENT WAVELENGTH DIVISION MULTIPLEXING SYSTEMS BASED ON ARRAYS OF WAVELENGTH TUNABLE LASERS AND WAVELENGTH TUNABLE RESONANT PHOTODETECTORS

(75) Inventors: Nikolai Ledentsov, Berlin (DE); Vitaly Shchukin, Berlin (DE)

(73) Assignee: NL Nanosemiconductor GmbH, Dortmund (DE)

( * ) Notice: Subject to any disclaimer, the term of this patent is extended or adjusted under 35 U.S.C. 154(b) by 371 days.

(21) Appl. No.: 10/455,186

(22) Filed: Jun. 5, 2003

(65) Prior Publication Data

US 2003/0206741 A1    Nov. 6, 2003

Related U.S. Application Data

(63) Continuation-in-part of application No. 09/867,167, filed on May 29, 2001, now Pat. No. 6,611,539.

(51) Int. Cl.
*H01S 3/10* (2006.01)
(52) U.S. Cl. ............ 372/20; 372/109; 372/43.01; 372/50.1; 372/50.121
(58) Field of Classification Search ............ 372/20, 372/109, 43.01, 50.1, 50.121; 257/13, 98, 257/80
See application file for complete search history.

(56) References Cited

U.S. PATENT DOCUMENTS

| 4,807,227 | A | * | 2/1989 | Fujiwara et al. | 398/48 |
|---|---|---|---|---|---|
| 5,216,686 | A | | 6/1993 | Holm et al. | 372/45 |
| 5,283,447 | A | | 2/1994 | Olbright et al. | 257/85 |
| 5,541,945 | A | | 7/1996 | Yamaguchi et al. | 372/20 |
| 5,606,572 | A | | 2/1997 | Swirhun et al. | 372/96 |
| 5,812,581 | A | | 9/1998 | Cox | 372/50 |
| 5,903,590 | A | | 5/1999 | Hadley et al. | 372/96 |
| 5,949,801 | A | | 9/1999 | Tayebati | 372/20 |
| 5,976,905 | A | | 11/1999 | Cockerill et al. | 438/36 |
| 6,001,664 | A | | 12/1999 | Swirhun et al. | 438/31 |
| 6,026,108 | A | | 2/2000 | Lim et al. | 372/50.11 |
| 6,031,243 | A | | 2/2000 | Taylor | 257/13 |
| 6,046,065 | A | | 4/2000 | Goldstein et al. | 438/46 |
| 6,064,683 | A | | 5/2000 | Johnson | 372/46 |
| 6,088,376 | A | | 5/2000 | O'Brien et al. | 372/50 |
| 6,160,834 | A | | 12/2000 | Scott | 372/96 |
| 6,392,256 | B1 | | 5/2002 | Scott et al. | 257/184 |
| 6,411,638 | B1 | | 6/2002 | Johnson et al. | 372/46 |
| 6,445,495 | B1 | | 9/2002 | Walker et al. | 359/344 |

(Continued)

FOREIGN PATENT DOCUMENTS

EP    0765052    3/1997

(Continued)

OTHER PUBLICATIONS

Ledentsov, Nikolai N., "Nanostructures How Nature Does It", Educational Centre at IOFFE Institute Invited Lecture. Oct. 13, 2000. Http://web.edu.ioffe.ru/lectures/index_en.html.

(Continued)

*Primary Examiner*—Minsun Oh Harvey
*Assistant Examiner*—Delma R. Flores-Ruiz
(74) *Attorney, Agent, or Firm*—Brown & Michaels, PC

(57) ABSTRACT

A wavelength division multiplexing system based on arrays of wavelength tunable lasers and wavelength tunable resonant photodetectors is disclosed. The system allows self-adjusting of the resonance wavelength of the wavelength tunable photodetectors to the wavelengths of the laser light emitted by the lasers. No precise wavelength stabilization of the lasers is required.

62 Claims, 13 Drawing Sheets

U.S. PATENT DOCUMENTS

| | | | |
|---|---|---|---|
| 6,611,539 B1 * | 8/2003 | Ledentsov et al. | 372/20 |
| 6,697,413 B1 | 2/2004 | Hwang et al. | 372/96 |
| 2002/0101904 A1 | 8/2002 | Baillargeon et al. | 372/98 |
| 2002/0106160 A1 | 8/2002 | Cox et al. | 385/49 |
| 2002/0131458 A1 | 9/2002 | Sirbu et al. | 372/20 |
| 2002/0181519 A1 * | 12/2002 | Vilhelmsson et al. | 372/32 |
| 2003/0087121 A1 * | 5/2003 | Domash et al. | 428/641 |
| 2003/0091083 A1 | 5/2003 | Hwang et al. | 372/46 |
| 2003/0133641 A1 * | 7/2003 | Yoo | 385/14 |
| 2003/0185267 A1 | 10/2003 | Hwang et al. | 372/96 |
| 2003/0213950 A1 | 11/2003 | Hwang et al. | 257/18 |

FOREIGN PATENT DOCUMENTS

| | | |
|---|---|---|
| EP | 1041761 | 10/2000 |
| WO | WO00/65700 | 11/2000 |
| WO | WO02/07359 | 1/2002 |

OTHER PUBLICATIONS

S. V. Kartalopoulos; *"Introduction to DWDM Technology. Data in a Rainbow"*, Wiley-Interscience, New York (2000).

*"Vertical-Cavity Surface-Emitting Lasers: Design, Fabrication, Characterization, and Applications"*; by C.W. Wilmsen, H. Temkin, L.A. Coldren (editors), Cambridge University Press, 1999.

H.C. Casey, Jr., and M.B. Panish, *Heterostructure Lasers*, Part A, Academic Press, N.Y. 1978 pp. 33-43, 70-79, and 164-187.

S. Adachi, *"GaAs, AlAs, and $Al_xGa_{1-x}As$: Material parameters for use in research and device applications"* Journal of Applied Physics. vol. 58, pp. R1-R29 (1985).

Y.P. Feng and H.N. Spector, *"Exciton Energies as a Function of Electric Field: Confined Quantum Stark Effect"*, Physical Review B. vol. 48, 1963-1966 (1993).

R. Houdré, R.P. Stanley, U. Oesterle, M. Ilegems, and C. Weisbuch, *"Room-temperature cavity polaritons in a semiconductor microcavity"*, Physical Review B. vol. 49, issue 23, pp. 16761-16764 (1994).

Y. Chiba and Sh. Ohnishi, *"Resonsnce-state calculation applying Weyl-Titchmarsh theory: Application for the quantum-confined Stark effects on excitons in a $GaAs-Al_xGa_{1-x}As$ quantum well"*, Physical Review B, vol. 41, pp. 6065-6068 (1990).

N.N. Ledentsov, V.A. Shchukin; *"Novel Concepts for Injection Lasers"*, SPIE Optical Engineering, vol. 41, issue 12, pp. 3193-3203 (2002).

N.N. Ledentsov et al., "1.3 um Luminescence and Gain From Defect-Free InGaAs-GaAs Quantum Dots Grown By Metal-Organic Chemical Vapor Deposition." Semicond. Sci. Technol. 15, 2000, pp. 604-607.

Stone, R. J. et al., "Independent Phase and Magnitude Control of an Optically Carried Microwave Signal with a Three-Terminal Vertical-Cavity Surface-Emitting Laser," IEEE Photonics Technology Letters, vol. 11, No. 5 (Apr. 1999), pp. 463-465.

Wipiejewski, T. et al., "Tunable Extremely Threshold Vertical-Cavity Laser Diodes," IEEE Photonics Technology Letters, vol. 5, No. 8, (Aug. 1993), pp. 889-892.

Hudgings, Janice A. et al., "Dynamic Behavior and Applications of a Three-Contact Vertical-Cavity Surface-Emitting Laser," IEEE Journal of Selected Topics in Quantum Electronics, vol. 5, No. 3, (May/Jun. 1999), pp. 512-519.

Zucker, J. E. et al., Large Refractive Index Changes in Tunable-Electron-Density InGaAs/InAlAs Quantum Wells, IEEE Photonics Technology Letters, vol. 2, No. 1 (Jun. 1990), pp. 29-31.

Thirstrup, Carsten, "Refractive Index Modulation Based on Excitonic. Effects in GaInAs-Inp Coupled Asymmetric Quantum Wells," IEEE Journal of Quantum Electronics, vol. 31, No. 6, (Jun. 1995), pp. 988-996.

Amann, Markus-Christian, "Single-Mode and Tunable Laser Diodes," Semiconductor Lasers 11: Materials and Structures, Academic Press, 1999, Chapter 3, pp. 157-251.

Yokouchi et al. "Estimation of Tunable Wavelength Range in Surface Emitting Laser Using Intra-Cavity Quantum-Well Tuner." Transactions of the Institute of Electronics, Information and Communication Engineers E, vol. E73, No. 9, Sep. 1990, pp. 1473-1475.

Yokouchi et al. "Loss and Index Change in GAINSP/INP Multiple Quantum Well QCSE Tuning Element For Surface Emitting Lasers." Proceedings of the International Conference of Indium Phosphide and Related Materials. vol. Conf. 5, Apr. 1993.

Gmachl et al. "Frequency Tuning of VCSELs by a Monolithically Integrated Modular Diode." LEOS '95, IEEE Lasers and Electro-Optcs Society 1995 Annual Meeting. 8th annual meeting. Conference Proceedings (CAT. No. 95CH35739). IEEE, vol. 2, pp. 431-432, 1995.

Wu, M.S. et al. "Widely and Continuously Tunable Micromachined Resonant Cavity Detector With Wavelength Tracking." IEEE Photonics Technology Letters, vol. 8, No. 1, Jan. 1996 p. 98-100.

\* cited by examiner (a)

(b)

INTELLIGENT WAVELENGTH DIVISION MULTIPLEXING SYSTEMS BASED ON ARRAYS OF WAVELENGTH TUNABLE LASERS AND WAVELENGTH TUNABLE RESONANT PHOTODETECTORS

REFERENCE TO RELATED APPLICATIONS

This is a continuation-in-part of U.S. patent application Ser. No. 09/867,167, filed May 29, 2001 now U.S. Pat. No. 6,611,539, entitled "WAVELENGTH-TUNABLE VERTICAL CAVITY SURFACE EMITTING LASER AND METHOD OF MAKING SAME". The aforementioned application is hereby incorporated herein by reference.

BACKGROUND OF THE INVENTION

1. Field of the Invention

The invention pertains to the field of semiconductor devices and to the field of data communication systems and data communication networks.

2. Description of Related Art

A steadily increasing flow of information requires improvements to existing technology of data transport and development of new devices and systems. Transporting signals at 10 Gb/s over a single-mode optical fiber has become a technology of the past. Transporting 40 Gb/s over a single-mode fiber for 100 km is an advanced technology that is becoming readily available. At 40 Gb/s, half-a-million simultaneous telephone conversations can be transmitted. Transporting above 40 Gb/s is the next challenge.

Advances in laser and optoelectronic device technology have made it possible to transmit more than one wavelength in the same fiber. This practice is known as wavelength division multiplexing (WDM). Adding wavelengths in the same fiber effectively increases the bandwidth capacity of a fiber and thus negates the immediate need to install additional fibers or increase the data bit rate to extremely high levels. In the full low-loss wavelength range of a single mode fiber (1.2–1.6 µm), some 1000 wavelength channels separated by 50 GHz may be used. At 40 Gb/s per wavelength, a total aggregate bandwidth of 40 Tb/s per fiber may be achieved (S. V. Kartalopoulos; "Introduction to DWDM Technology. Data in a Rainbow", Wiley Interscience, New York (2000)).

Typically, WDM systems, or dense wavelength division multiplexing (DWDM) systems, used in long-haul and metropolitan area applications are based on expensive single lateral and longitudinal mode telecom transmitters. Wavelength tunable lasers offer a promising advantage. For DWDM applications, tunable lasers are advantageous because they provide laser switching between different channels, thus reducing the number of expensive devices and simplifying DWDM protocols (S. V. Kartalopoulos; "Introduction to DWDM Technology. Data in a Rainbow", Wiley-Interscience, New York (2000)). Tunable lasers operating at or near 1.55 µm are currently used and in the future the whole 1.2–1.7 µm range is likely to be covered to provide sufficient bandwidth.

Traditional wavelength-tunable lasers are very expensive. They also require precise wavelength stabilization, which is usually achieved by using sophisticated temperature control and a feedback detection system to provide wavelength locking for each device. Using tunable laser arrays, and, in particular, arrays of vertical-cavity surface-emitting lasers (VCSELs), may reduce the cost of DWDM systems, as the production cost for a single laser channel in the array is much smaller than the cost of an individual laser. The costs of packaging, optical alignment, focusing, temperature and stabilization, which compose the major production costs of the device, do not scale with the number of the devices in the array contributing only once. Thus, tremendous cost reduction is possible. However, DWDM applications require devices with different and well-defined wavelengths, which is not normally possible for conventional single-chip VCSELs. For the full low-loss range of a single mode fiber (1.2–1.6 µm), some 1000 wavelength channels separated by 50 GHz may be used. At 40 Gb/s per single wavelength channel, a total aggregate bandwidth of 40 Tb/s per fiber may be achieved. For example, DWDM standard (ITU-T Recommendation G.692) defines 43 wavelength channels from 1530 to 1565 nm, with a spacing of 100 GHz, each channel carrying an OC-192 signal at 10 Gb/s (S. V. Kartalopoulos; "Introduction to DWDM Technology. Data in a Rainbow", Wiley-Interscience, New York (2000)). Thus, a typical spacing of 0.8 nm between channels is required for 100 GHz.

Currently, wavelength-adjustable intelligent WDM and DWDM systems do not exist. The standard DWDM approach requires a precisely fixed wavelength. The only possibility to use wavelength-tunable lasers is to reduce inventory of fixed-wavelength lasers. The system itself always remained the same: many different fixed-wavelength light beams from different light sources are coupled to a single fiber (multiplexing) and separated at the exit of the fiber into different channels (demultiplexing), each channel operating with a separate photodetector. All the presently existing wavelength multiplexing and demultiplexing approaches are based on a precisely fixed wavelength of each DWDM channel. This makes DWDM systems very expensive.

Currently existing wavelength-tunable lasers may be edge-emitting lasers or VCSELs. Edge-emitting devices are conventionally fabricated as distributed-feedback lasers to ensure single longitudinal mode operation. Wavelength tuning by tuning the refractive index can be applied to these devices. This tuning can be achieved, for example, by a heat sink temperature change. Modulation of the refractive index may be caused by an electron-hole plasma effect due to the changing concentration of nonequilibrium carriers in the specially introduced distributed feedback (DFB) section. A DFB mechanism can be provided, for example, by etching a grating on the surface of the epiwafer, followed by subsequent overgrowth. For the same period of the grating, a change in the refractive index causes wavelength shift of the DFB modes. Usually different sections of the same in-plane waveguide structure are used in a real device.

Another way to achieve wavelength tunability in both edge-emitting and surface emitting lasers is to use external mirrors or diffraction gratings. Here, the tuning is realized by mechanical tuning of the effective cavity length of the device, or by angle adjustment of the diffraction grating mirror affecting the wavelength of peak reflectivity. In VCSELs, tuning of the cavity length may be realized by using different micro-electromechanical systems.

A disadvantage of both types of conventional tunable lasers is a long tuning time. In one case, the rate is limited by the time for tuning the heat-sink temperature, or the electron-hole plasma concentration. In the other case, the slow rate is related to the mechanical nature of the external mirror adjustment mechanism used. Frequency modulation signal transmission systems are generally not possible using these approaches.

Mechanically tunable lasers also suffer from various detuning mechanisms caused by material aging, humidity, and dirt absorption at gratings or suspended tunable mirrors. Vibrations can cause errors. Techniques to maintain wavelength stability (wavelength locking) are necessary for each of the separate devices, even in the case where laser arrays are used. If a wavelength-locking mechanism is applied to each of the devices in the array, it is more difficult to create cost-efficient systems.

There is a need in the art for improved wavelength tunable lasers and photodetectors and their application to novel wavelength division multiplexing systems.

SUMMARY OF THE INVENTION

A wavelength division multiplexing system is based on arrays of wavelength tunable lasers and wavelength tunable resonant photodetectors. The system allows self-adjusting of the resonance wavelength of the wavelength tunable photodetectors to the wavelengths of the laser light emitted by the lasers. No precise wavelength stabilization of the lasers is required.

DETAILED DESCRIPTION OF THE INVENTION

A wavelength-tunable vertical cavity surface emitting laser was disclosed in U.S. patent application Ser. No. 09/867,167, which is incorporated herein by reference. The device is based on a cavity position-dependent electrooptical effect. The vertical cavity comprises an active element, which generates light when a forward bias is applied, and a phase control element. The phase control element contains a modulator exhibiting a strong narrow optical absorption peak on a short wavelength side from the wavelength of the laser generation. The wavelength control is realized by using a position-dependent electro-optical effect. If a reverse bias is applied, the absorption maximum is shifted to longer wavelengths due to the Stark effect. If a forward bias is applied, a current is injected and results in the bleaching and reduction of the peak absorption. In both cases a strong modulation of the refractive index in the phase control element occurs. The effect tunes the wavelength of the cavity mode, and the sign and the value of the wavelength shift are defined by the position of the modulator.

The tunable vertical cavity surface emitting laser comprises two primary elements: 1) an active region and 2) a phase control element above the active region. These primary elements are sandwiched between two mirrors. The active element and the modulator are surrounded by undoped, or weakly doped, layers surrounded by n- and p-contact layers. Either electric fields or injection currents are used to control and tune the laser.

The phase control element is a modulator surrounded on both sides by undoped or weakly doped layers which are in turn surrounded by n- and p-contact layers. An electric field is used to tune the refractive index of the modulator.

The preferred embodiment provides a tunable laser with an active region and the phase control regions placed in different media. The tunable laser uses an effect of the refractive index control by tuning the resonant absorption optical spectrum by applying an electric field. Alternatively, the tunable laser can use the effect of the modulation of refractive index by injection of the current.

The wavelength of the emitted light and the output power can be tuned independently. The rate of the wavelength tuning is defined by the speed of electric field distribution in the phase control layer and may be in the picosecond range. The invention offers the possibility to realize wavelength-tunable vertical cavity surface-emitting lasers operating at frequencies up to approximately 50 GHz. The output power is equalized using weak absorption, selective in the frequency of light, which compensates the frequency-dependent absorption of light by the modulator.

In one of the embodiments, a wavelength tunable vertical cavity surface emitting laser includes an element which is used as the photodetector to measure the output power and thus to calibrate the laser for all operations.

Figure 13:
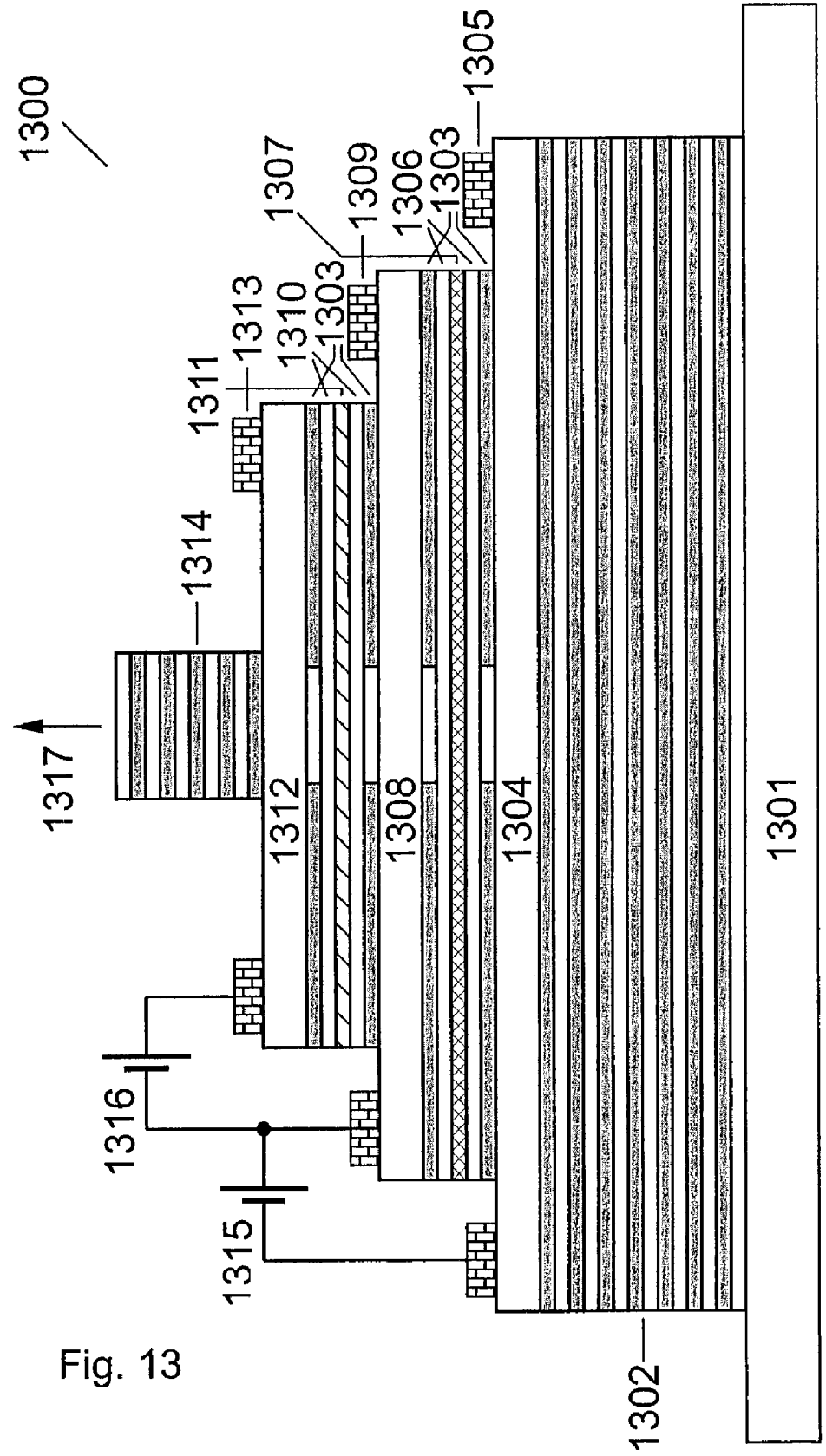
FIG. 13 shows a schematic diagram of a vertical cavity surface emitting laser in which the active element, as usually operates under forward bias, and the phase control element operates under reverse bias.

Referring to FIG. 13, an example of a novel tunable vertical cavity surface emitting laser is shown. The structure is grown epitaxially on the substrate (1301). Bragg reflectors are used for the bottom mirror (1302). The rest of the VCSEL comprises two primary elements: 1) an active element above the bottom mirror (1302) and 2) a phase control element above the active region.

To form the active element, a current aperture (1303) separates an n-doped current spreading layer (1304), with a first metal contact (1305), from the weakly doped layers (1306) surrounding the active element (1307). A second current aperture (1303) separates the weakly doped layer (1306) from a p-doped current spreading layer (1308), with a second metal contact (1309). The n-doped current spreading layer (1304) sits directly on top of the bottom mirror (1302).

To form the phase control element, two weakly doped layers (1310) surrounding the modulator (1311) are separated from the p-doped current spreading layer (1308) by a third current aperture (1303). A fourth current aperture separates the weakly doped layer (1310) from a second n-doped current spreading layer (1312), with a third metal contact (1313). Distributed Bragg reflectors are also used for a top mirror (1314) that is on top of the phase control element.

The active element operates under forward bias (1315) as is typical for VCSEL's. The novel component of the VCSEL is an additional phase control element that is shown in FIG. 13 being operated under reverse bias (1316). The light comes out (1317) through the top mirror (1314).

The substrate (1301) can be formed from any III-V semiconductor material or III-V semiconductor alloy, e.g. GaAs, InP, GaSb, or others. The preferred embodiment as used in the present invention is GaAs.

The n-doped layers (1304) and (1312) must be formed from the material lattice-matched or nearly lattice-matched to the substrate, transparent to the generated light, and doped by donor impurities. The preferred embodiment is the same material as that of the substrate, e.g. GaAs. Possible donor impurities include, but are not limited to S, Se, Te, and amphoteric impurities like Si, Ge, Sn where the latter are introduced under such technological conditions that they are incorporated predominantly into the cation sublattice and serve as donor impurities.

The p-doped layer (1308) must be formed from a material, lattice-matched or nearly lattice-matched to the substrate, transparent to the generated light, and doped by an acceptor impurity. The preferred embodiment is the same material as the substrate, e.g. GaAs. Possible acceptor impurities include, but are not limited to Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The metal contacts (1305), (1309) and (1313) can be formed from the multi-layered metal structures. Contacts to the n-doped layered, i.e. contacts (1305) and (1313) can be formed from, but not limited to the structure Ni—Au—Ge. Contacts to the p-doped layer, i.e. contacts (1309) can be formed, but not limited to the structure Ti—Pt—Au.

The active element (1307) can be formed by any insertion, the energy band gap of which is narrower than that of the substrate. Possible embodiments include, but are not limited to a single-layer or a multi-layer system of quantum wells, quantum wires, quantum dots, or their combination. In a case of the device on a GaAs-substrate preferred embodiments for the active element include, but are not limited to a system of insertions of InAs, $In_{1-x}Ga_xAs$, $In_xGa_{1-x-y}Al_yAs$, $In_xGa_{1-x}As_{1-y}N_y$, or similar.

The modulator (1311) can be formed by any insertion, the energy band gap of which is narrower than that of a substrate. Possible materials and structures are same, as for an active element, but the particular design should be such, that the modulator (1311) exhibits a strong absorption peak on a high-energy side (on a shorter wavelength side) from the wavelength of the laser radiation.

Each layer is separated from the neighboring layer by a current aperture (1303) that works as a current blocking layer and can be formed from, but not limited to a Al(Ga)O layer or a proton bombardment layer.

Different designs for the bottom mirror (1302) and for the top mirror (1314) can be used, as described, e.g. in *Vertical-Cavity Surface-Emitting Lasers: Design, Fabrication, Characterization, and Applications* by C. W. Wilmsen, H. Temkin, L. A. Coldren (editors), Cambridge University Press, 1999. The preferred embodiment is a multi-layered dielectric mirror GaAs/AlGaO.

As an alternative, a different sequence of contacts can be used. The phase control element can comprise the n-contact layer, undoped or weakly doped layer, inside which a modulator (1311) is inserted, and the p-contact layer. Then, the p-contact layer of the active element and the n-contact layer of the phase control element can be separated by a $p^+n^+$ Esaki tunnel junction.

The laser in FIG. 13 operates as follows. The electric field created by the reverse bias (1316) is applied mainly to the undoped or weakly doped region (1310). The modulator (1311) is chosen to have a strong electrooptical effect. Under an external electric field controlled by the bias (1316), the refractive index of the modulator (1311) is tuned. The selection of the emission wavelength from the gain region of the optical spectrum is determined by the oscillation condition (H. C. Casey, Jr., and M. B. Panish, *Heterostructure Lasers*, Part A, Academic Press, N.Y. 1978). The optical path of the emitted electromagnetic wave includes the layer (1304), the aperture, the layer (1306) including the active region (1307), the aperture, the layer (1308), the aperture, the layer (1310) including the modulator (1311), the aperture, the layer (1312), all paths doubled including also reflection from both the bottom and the top mirrors. A variation of the refractive index in the modulator (1311), affects, first, the optical path of the light through the modulator (1311), and, second, the transmission coefficient of the light from the medium (1310) into the modulator (1311) and back from the modulator (1311) into the medium (1310).

The present invention expands on the wavelength-tunable vertical cavity surface emitting laser disclosed in U.S. patent application Ser. No. 09/867,167. In the present invention, a wavelength-tunable resonance photodetector, based on a cavity position-dependent electrooptical effect, is disclosed. Further, a wavelength division multiplexing system based on arrays of wavelength-tunable lasers and wavelength-tunable resonant photodetectors is disclosed. The present invention circumvents the requirement that a wavelength multiplexing system have a precisely fixed wavelength for each WDM (or DWDM) channel, and allows the channels to have flexible wavelengths.

Using electronically wavelength-tunable VCSELs (TVCSELs) and electronically wavelength-tunable resonant-cavity photodetectors (TRCPDs), and, moreover, on-chip arrays of TVCSELs and TRCPDs makes the creation of cost-efficient wavelength-flexible ultrahigh-speed WDM and DWDM systems possible.

Narrower spacing of 50 GHz and 25 GHz (0.4 and 0.2 nm wavelength separation, respectively) is also possible. In the case of a 4×4 VCSEL array, if each device offers possible 6 nm wavelength tuning with respect to some nominal wavelength, and assuming a 0.4 nm channel separation, one can use all 16 channels. Thus, having a tuning mechanism is an imperative for VCSEL arrays fabricated on a single chip. Being able to adjust wavelength separations for particular applications revolutionizes DWDM.

Figure 1:
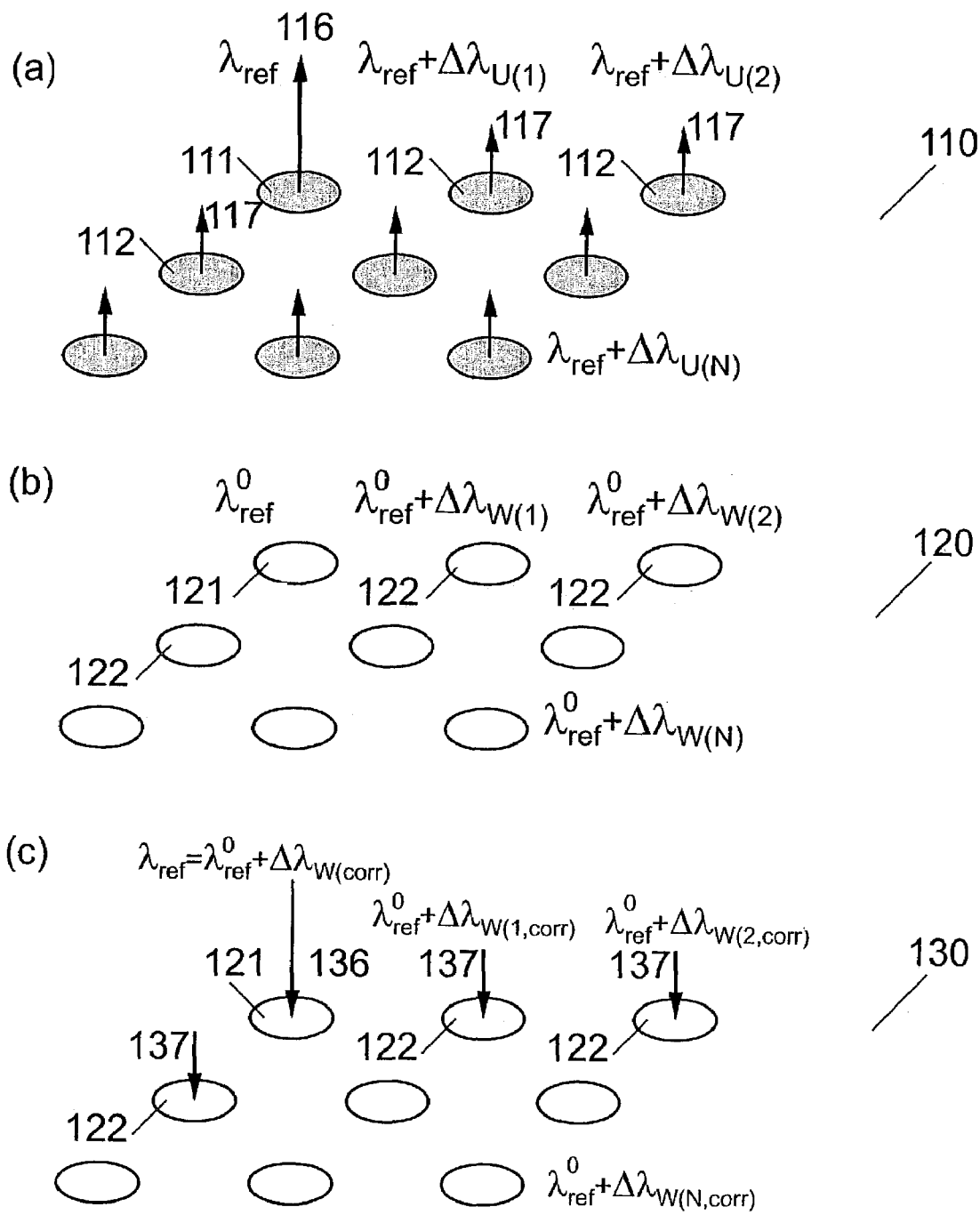
FIG. 1(a) shows a schematic illustration of an array of wavelength tunable lasers, with one reference laser and N data communication lasers.
FIG. 1(b) shows a schematic illustration of an array of wavelength tunable resonant photodetectors that are out of resonance with the laser light emitted by the array of wavelength tunable lasers and do not detect laser light.
FIG. 1(c) shows a schematic illustration of an array of wavelength tunable resonant photodetectors, which are, by a shift in resonant wavelengths, brought into a resonance with the laser light emitted by the array of wavelength tunable lasers and detect laser light.

FIG. 1 illustrates schematically an intelligent wavelength division multiplexing system according to an embodiment of the present invention. The system requires the use of one array of (N+1) tunable lasers and of one array of (N+1) wavelength tunable resonant photodetectors. FIG. 1(a) shows an array (110) of (N+1) wavelength tunable lasers. The wavelength of the laser light emitted by every laser is controlled by a control parameter U. The control parameter includes, but is not limited to, the following control parameters:
  a voltage for a wavelength tunable laser using a quantum confined Stark effect;
  an injection current for a wavelength tunable laser using an effect of bleaching;
  a position of an external mirror for a wavelength tunable laser using micromechanical modulation of the wavelength; or
  a voltage for a wavelength tunable laser based on the piezoelectric effect, where applied voltage tunes the width of the cavity.

One of the wavelength tunable lasers (111) is chosen to emit a reference laser light (116) at a reference wavelength $\lambda_{ref}$. Every other tunable laser (112) operates under a control parameter U(i), where the index i labeling the lasers runs from 1 to N, and emits a laser light (117) at a wavelength $\lambda_{ref}+\Delta\lambda_{U(i)}$. Control parameters U(i) are set such that the shift $\Delta\lambda_{U(i)}$ of the wavelength emitted by every given laser with respect to the reference wavelength $\lambda_{ref}$ equals a predefined value.

FIG. 1(b) shows an array (120) of (N+1) wavelength tunable resonant photodetectors. The wavelength, at which every photodetector has a resonant sensitivity, is controlled by a control parameter W. The control parameter includes, but is not limited to, the following control parameters:
  a voltage for a wavelength tunable resonant photodetector using a quantum confined Stark effect;
  an injection current for a wavelength tunable resonant photodetector using an effect of bleaching;
  a position of an external mirror for a wavelength tunable resonant photodetector using micromechanical modulation of the wavelength; or
  a voltage for a wavelength tunable resonant photodetector based on piezoelectric effect, where applied voltage tunes the width of the cavity.

One of the wavelength tunable resonant photodetectors is chosen to serve as a reference photodetector (121). It has resonant sensitivity to light at the wavelength $\lambda_{ref}^0$. Every other wavelength tunable resonant photodetector (122) operates under a control parameter W(j), where the index j labeling photodetectors runs from 1 to N, and has a resonant sensitivity to light at the wavelength $\lambda_{ref}^0+\Delta\lambda_{W(j)}$. Control parameters are preferably set such that the shift of the wavelength of maximum sensitivity of every j-th photodetector with respect to the reference wavelength for the array of photodetectors $\lambda_{ref}^0$ equals the corresponding shift of the wavelength of light emitted by the j-th laser with respect to the reference wavelength for lasing $\lambda_{ref}$, namely:

$$\Delta\lambda_{W(1)}=\Delta\lambda_{U(1)}, \quad (1a)$$

$$\Delta\lambda_{W(2)}=\Delta\lambda_{U(2)}, \quad (1b)$$

. . .

$$\Delta\lambda^{W(N)}=\Delta\lambda_{U(N)}. \quad (1c)$$

If the wavelength of maximum sensitivity of a reference photodetector (121) $\lambda_{ref}^0$ equals the wavelength of light emitted by the reference laser (111) $\lambda_{ref}$, then every j-th photodetector is resonantly sensitive to light emitted by the corresponding j-th laser. If $\lambda_{ref}^0 \neq \lambda_{ref}$, all photodetectors are out of resonance with light emitted by the corresponding lasers. In this case, the resonant wavelength of the reference photodetector (121) can be adjusted to the wavelength of light emitted by the reference laser (111).

FIG. 1(c) shows schematically an array (130) of wavelength tunable resonant photodetectors, where the reference photodetector (121) operates under a certain value of the control parameter W(corr), adjusted such that the wavelength of the maximum resonant sensitivity of the reference photodetector (121) coincides with the wavelength of light (136) emitted by the reference laser (111), $$\lambda_{ref}=\lambda_{ref}^0+\Delta\lambda_{W(corr)}. \quad (2)$$

When the reference photodetector (121) is adjusted to the wavelength emitted by the reference laser (111), the required shift of the wavelength $\Delta\lambda_{W(corr)}$ is known. Then it is possible to set, for each j-th tunable resonant photodetector, the control parameter W(j) such that it provides the same shift of the wavelength, namely:

$$\Delta\lambda_{W(1,corr)}=\Delta\lambda_{W(corr)}, \quad (3a)$$

$$\Delta\lambda_{W(2,corr)}=\Delta\lambda_{W(corr)}, \quad (3b)$$

. . .

$$\Delta\lambda_{W(N,corr)}=\Delta\lambda_{W(corr)}. \quad (3c)$$

When the control parameters for the entire array of resonant photodetectors are set according to Eqs. (3a)–(3c), every j-th photodetector is resonantly sensitive to the laser light emitted by the corresponding j-th laser.

Figure 2:
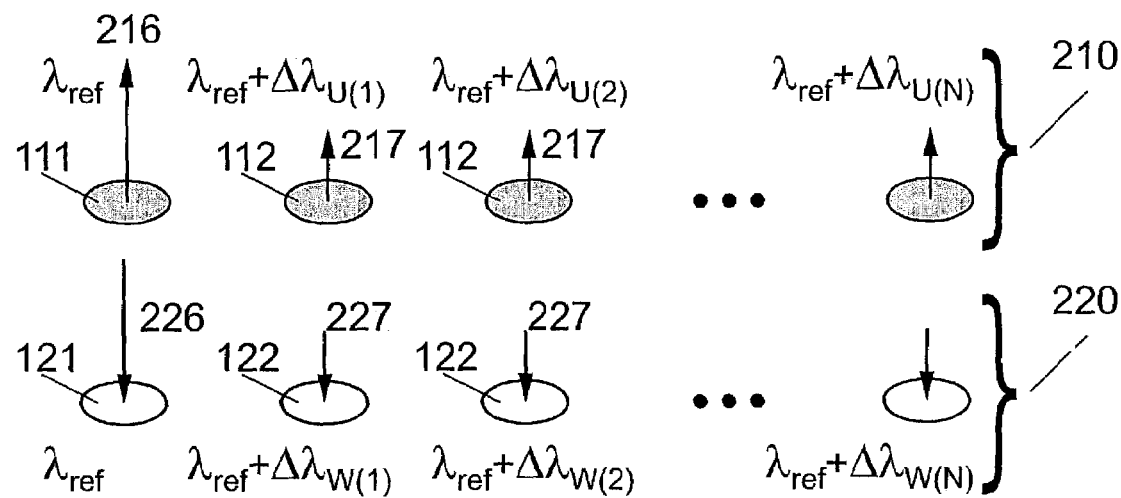
FIG. 2(a) shows a schematic illustration of an array of wavelength tunable lasers and an array of wavelength tunable resonant photodetectors, where control parameters controlling the wavelengths of the devices are set to bring each photodetector into resonance with the laser light from the corresponding laser.
FIG. 2(b) shows a schematic illustration of the array of wavelength tunable lasers and the array of wavelength tunable resonant photodetectors, where the two arrays are located at different locations, operate at different temperatures and are, therefore, out of resonance.
Figure 2:
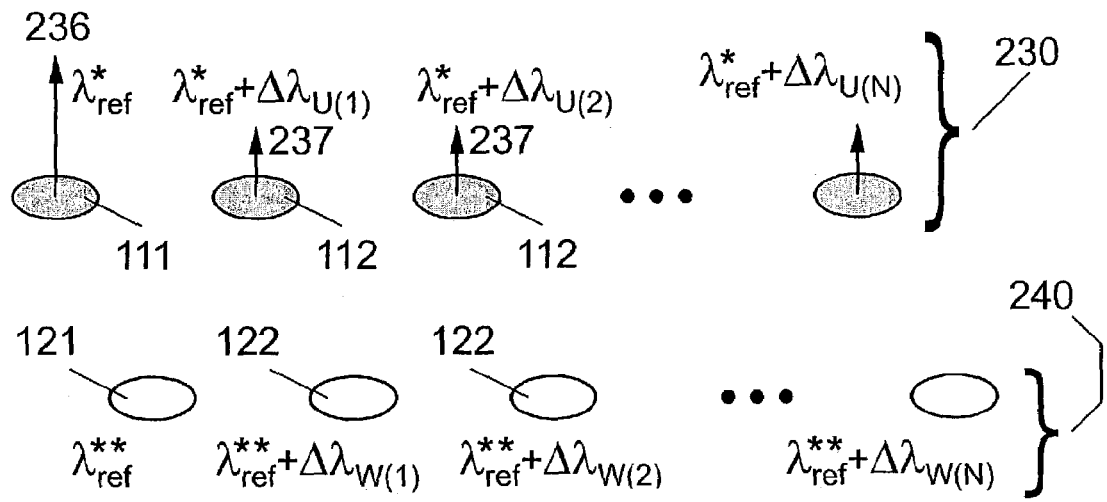

FIG. 2 further illustrates the principle of data link based on an array of wavelength tunable lasers and an array of wavelength tunable resonant photodetectors. FIG. 2(a) illustrates schematically an array of wavelength tunable lasers (210), and an array of wavelength tunable resonant photodetectors (220), which are adjusted in the sense that the following two conditions are fulfilled. First, the control parameters $U(1), U(2), \ldots, U(N)$ controlling the shift of the wavelength emitted by each given i-th laser with respect to the wavelength of the reference laser, and the control parameters $W(1), W(2), \ldots, W(N)$ controlling the shift of the resonant wavelength of the maximum sensitivity of each given j-th resonant photodetector with respect to the resonant wavelength of the reference photodetector, are set such that they obey Eqs. (1a)–(1c). Second, the resonant wavelength $\lambda_{ref}$ of the reference photodetector (121) is set to be equal to the wavelength emitted by the reference laser (111). Under these conditions, the whole array of resonant photodetectors (220) is adjusted to the array of lasers (210).

However, since the array of lasers and the array of photodetectors are located at different locations, they normally operate at different temperatures, as illustrated in FIG. 2(b). The array of wavelength-tunable lasers (230) operates under such conditions that the reference laser (111) emits laser light as a wavelength $\lambda_{ref}^*$. The wavelengths of the other lasers (112) are shifted according to the set values of the control parameters $U(i)$. The array of wavelengths tunable resonant photodetectors (240) operates under such conditions that the resonant wavelength of the reference photodetector (121) is $\lambda_{ref}^{}$, whereas $$\lambda_{ref}^{} \neq \lambda_{ref}^*. \tag{4}$$

Then, the reference photodetector (121) does not receive light (236) emitted by the reference laser, and each of the resonant photodetectors (122) does not receive light (237) emitted by the corresponding laser. The photodetectors do not detect laser light.

Figure 3:
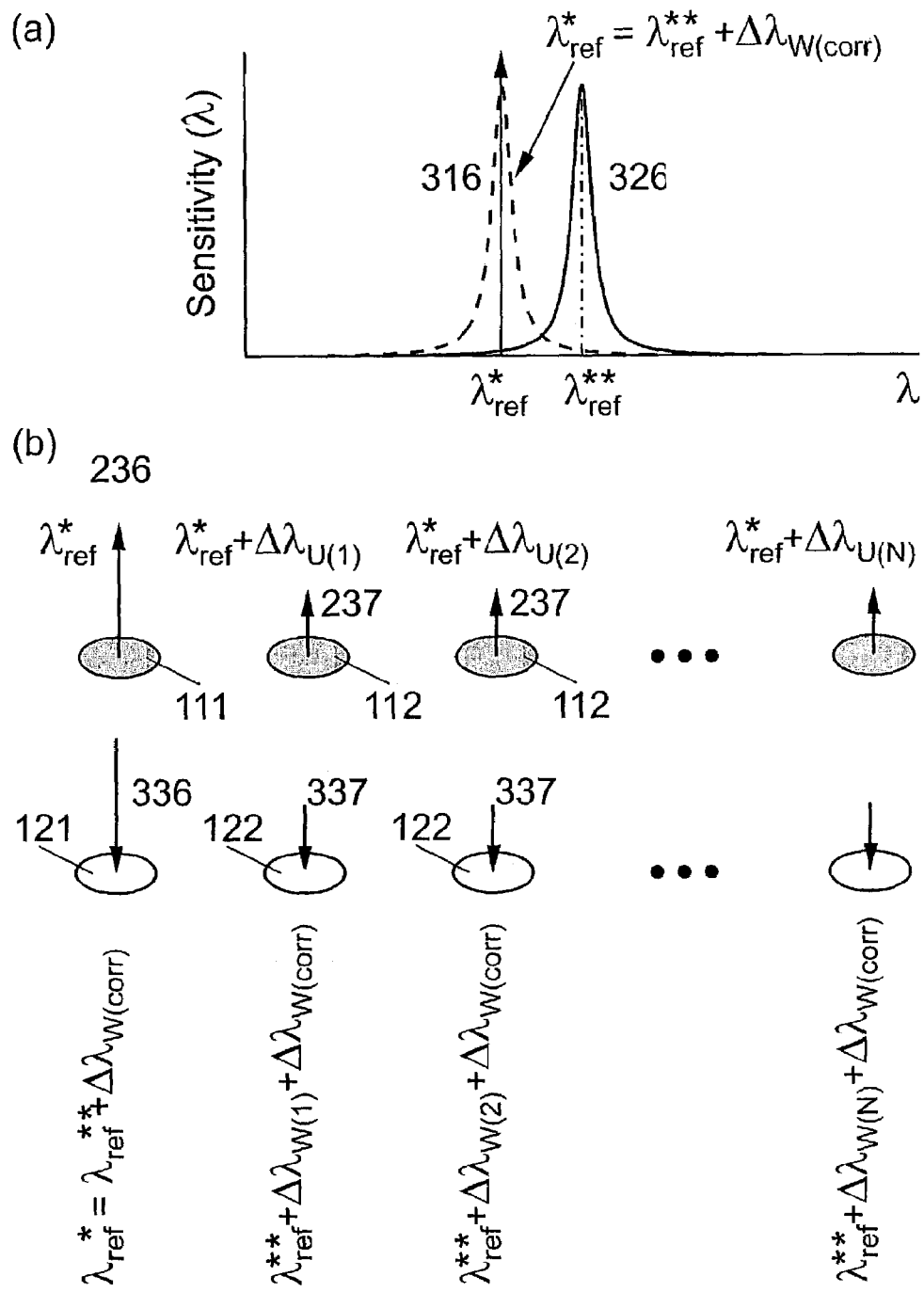
FIG. 3(a) shows a schematic illustration of a method of self-adjustment of a reference wavelength tunable resonant photodetector, where the resonance wavelength of the photodetector is tuned until the detected signal reaches its maximum value.
FIG. 3(b) shows a schematic illustration of an array of wavelength tunable lasers and an array of wavelength tunable resonant photodetectors, where the resonant wavelengths of the photodetectors are shifted by the same wavelength shift, and all photodetectors are in resonance with the laser light emitted by the corresponding lasers and detect laser light.

FIG. 3 illustrates a method of adjusting the resonant wavelength of the reference photodetector to the reference wavelength of the reference laser.

1. FIG. 3(a) shows the spectrum (326) of the sensitivity of the reference resonant photodetector. The spectrum is initially centered at the wavelength $\lambda_{ref}^{**}$, different from the wavelength $\lambda_{ref}^*$ of the laser light emitted by the reference laser. The resonant wavelength of the photodetector coincides with the wavelength of the laser light emitted by the reference laser.
2. Then the control parameter $W(corr)$ is applied to the reference resonant photodetector, which shifts the resonant wavelength. The control parameter $W(corr)$ is systematically varied, and the resonant wavelength of the reference resonant photodetector changes correspondingly. The signal provided by the photodetector, e.g., the photocurrent, is observed.
3. At the value of the control parameter, at which the resonant wavelength of the photodetector coincides with the wavelength of the laser light emitted by the reference laser, the signal provided by the photodetector reaches its maximum value. The spectrum of the sensitivity of the photodetector in this case is shown in FIG. 3(a) by the dashed line (316). The wavelength of the laser light corresponds to the sensitivity maximum.

The value of the control parameter $W(corr)$, at which the resonance of the reference photodetector matches to the laser light emitted by the reference laser, $$\lambda_{ref}^{**} + \Delta\lambda_{W(corr)} = \lambda_{ref}^*, \tag{5}$$

and the corresponding shift of the wavelength $\Delta\lambda_{W(corr)}$ are fixed.

4. Then the control parameters controlling the resonant wavelengths of the remaining resonant photodetectors are set to the values $W(1,corr), W(2,corr), \ldots, W(N,corr)$ to provide the additional shift of the wavelength equal to $\Delta\lambda_{W(corr)}$. Namely, $$\Delta\lambda_{W(1,corr)} = \Delta\lambda_{W(1)} + \Delta\lambda_{W(corr)}, \tag{6a}$$

$$\Delta\lambda_{W(2,corr)} = \Delta\lambda_{W(2)} + \Delta\lambda_{W(corr)}, \tag{6b}$$

$$\ldots$$

$$\Delta\lambda_{W(N,corr)} = \Delta\lambda_{W(N)} + \Delta\lambda_{W(corr)}. \tag{6c}$$

5. Since initial shifts of the resonant wavelengths of each of the j-th photodetectors, $\Delta\lambda_{W(j)}$, with respect to the resonant wavelength of the resonant photodetector, and the shifts of the wavelengths of the laser light emitted by each of the j-th laser, $\Delta\lambda_{U(j)}$, with respect to that of the reference laser, obey Eqs. (1a)–(1c), the additional shift of the resonant wavelengths of the photodetectors by the same value $\Delta\lambda_{W(corr)}$ brings each j-th photodetector in the resonance with the corresponding j-th laser.

FIG. 3(b) illustrates an array of lasers (330) and an array of resonant photodetectors (340), which are self-adjusted as described. The reference photodetector (121) is adjusted to the reference laser (111), and the laser light (236) emitted by the reference laser (111) is received (336) by the reference photodetector (121). Then, when the resonant wavelength of all other photodetectors is shifted by the same value $\Delta\lambda_{W(corr)}$, the laser light (237) emitted by each of the remaining lasers (112) is received (337) by the corresponding photodetector (122).

Figure 4:
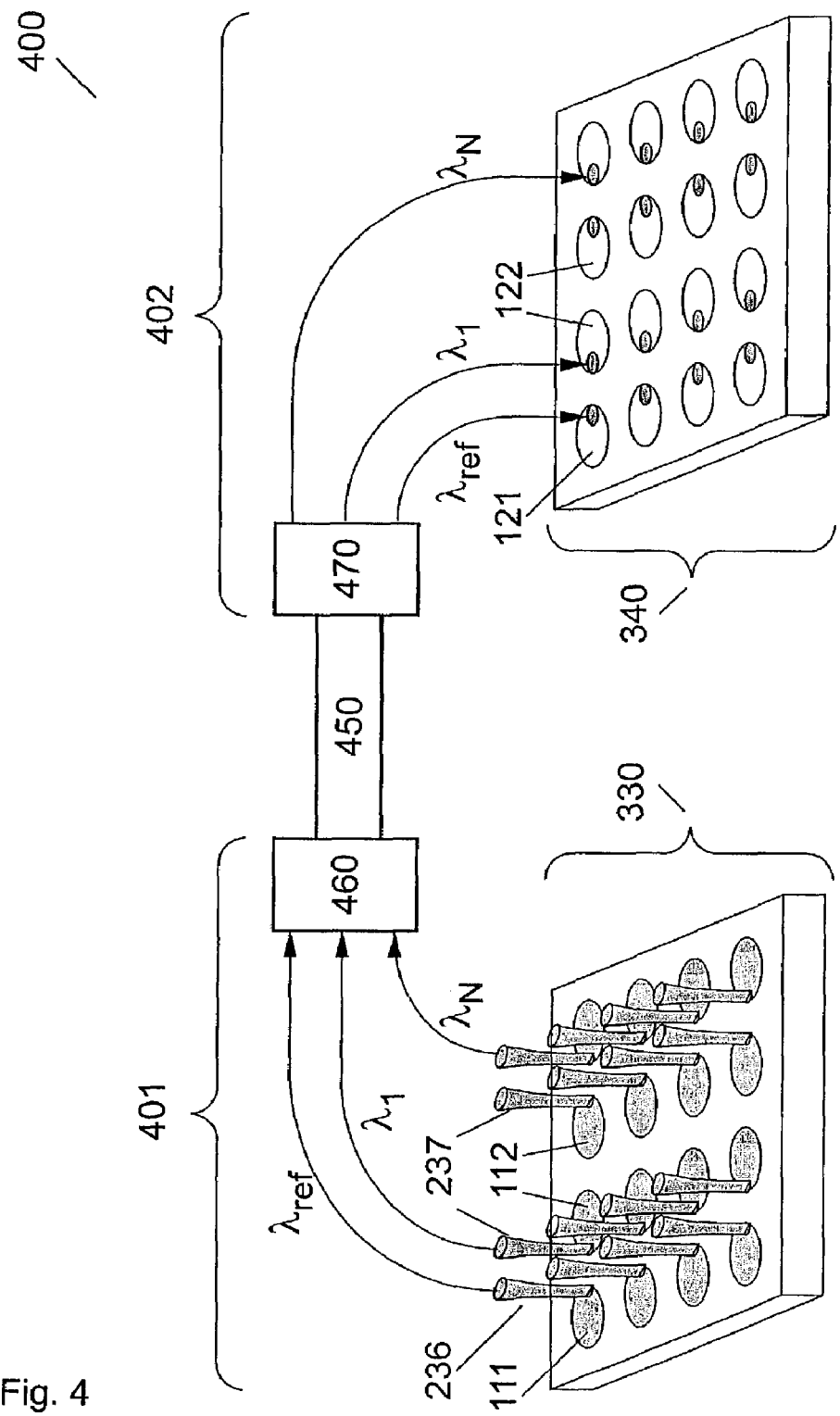
FIG. 4 shows a schematic illustration of a wavelength division multiplexing system according to an embodiment of the present invention.

FIG. 4 illustrates a wavelength division multiplexing system (400) according to an embodiment of the present invention. The system includes an array of wavelength tunable lasers (330) located at the location (401), an array of wavelength tunable resonant photodetectors (340), located at the location (402), and a communication medium (450). For this embodiment of the present invention, an optical fiber is preferably used as the communication medium. The wavelength division multiplexing system (400) also preferably includes a multiplexing element (460) and a demultiplexing element (470).

Laser light emitted by all wavelength tunable lasers of the array (330), each laser emitting at its own wavelength, is directed, via the multiplexing element (460), into the optical fiber (450). At the location (402), laser light at each wavelength is directed, via the demultiplexing element (470), to a corresponding photodetector of the array (340). One advantage of the wavelength division multiplexing system of the present invention is self-adjustment of the resonant wavelength of each photodetector to the wavelength of the laser light emitted by the corresponding laser. No precise wavelength stabilization of the lasers is required. The self-adjustment of two arrays allows the system to operate without precise wavelength stabilization of the lasers and without temperature stabilization.

Various media can be used as communication media in the wavelength division multiplexing system of the present invention. Possible media include, but are not limited to, an optical fiber, free space, and a semiconductor chip.

In another embodiment of the present invention, the system contains no multiplexing element (460). For example, if free space is used as a communication media, no multiplexing element is needed.

In yet another embodiment of the present invention, the system contains no demultiplexing element (470). In this embodiment, laser light at all wavelengths comes to each resonant photodetector. However, since the photodetectors are designed such that the resonance is sufficiently narrow, each photodetector can receive the wavelength from one channel only. When the photodetectors are self-adjusted to the wavelengths of the laser light emitted by the corresponding lasers, each photodetector receives light emitted by the corresponding laser and does not receive light emitted by the other lasers.

The wavelength division multiplexing system of the present invention is optionally used as a part of a communication network. Such communication networks include, but are not limited to, a long-haul network, a metropolitan area network, a local area network, a data storage network, computer interconnects, or an automobile network.

U.S. patent application Ser. No. 09/867,167 disclosed a wavelength-tunable vertical cavity surface emitting laser based on a position-dependent electrooptical effect. A wavelength-tunable vertical cavity surface emitting laser which comprises a photodetecting element is disclosed in one of the application's embodiments.

In one embodiment of the present invention, the wavelength tunable resonant photodetectors comprise an array, which is a part of the wavelength division multiplexing system, based on a position-dependent electrooptical effect.

Figure 5:
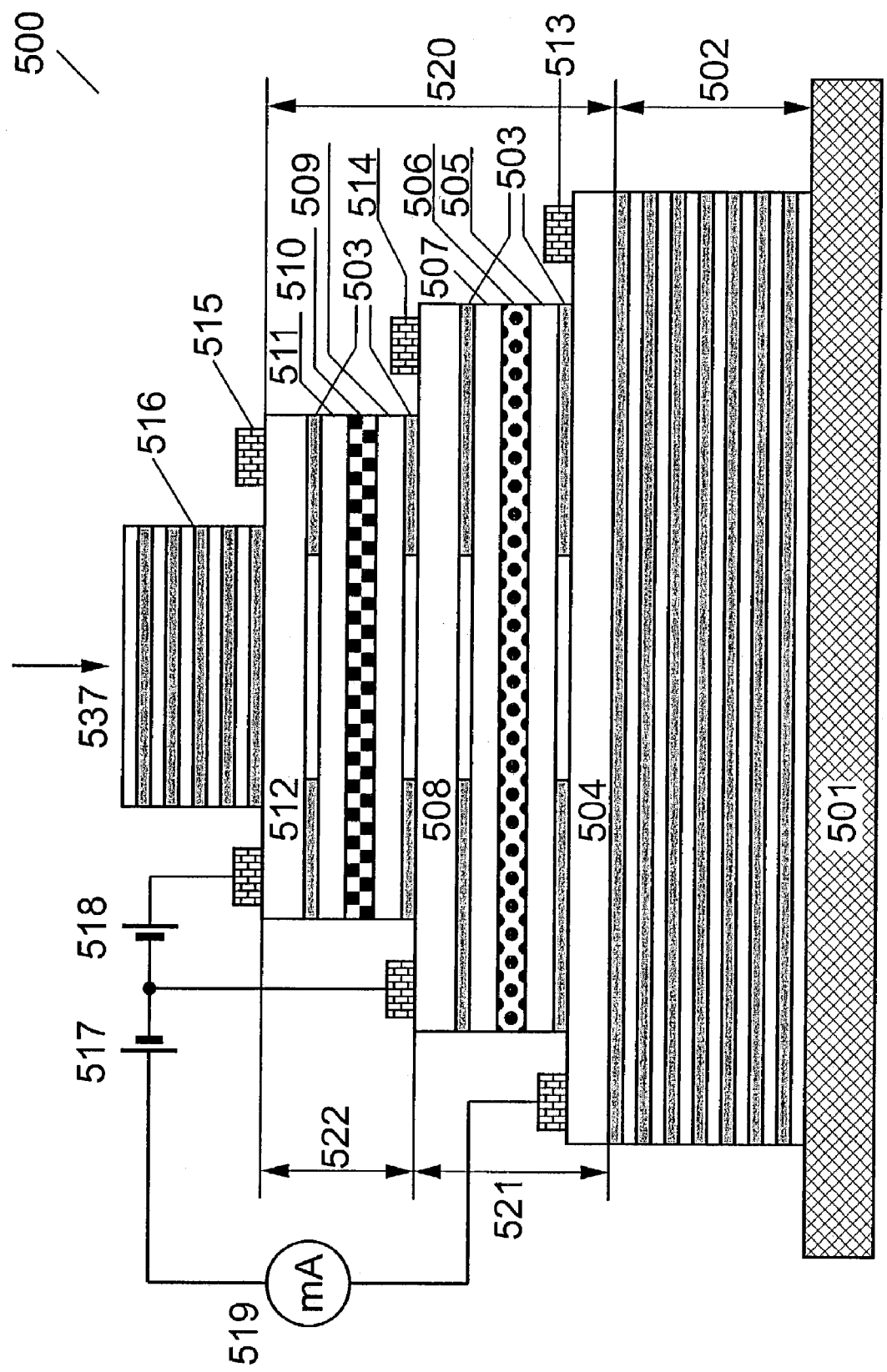
FIG. 5 shows a schematic illustration of a wavelength tunable semiconductor vertical cavity resonance photodetector according to an embodiment of the present invention.

FIG. 5 shows an example of a novel wavelength tunable resonant photodetector (500) formed in accordance with the present invention. The structure is grown epitaxially on the substrate (501). The structure includes the bottom mirror (502), the cavity (520), and the top mirror (516), where the cavity (520) is sandwiched between the bottom mirror (502) and the top mirror (516). A distributed Bragg reflector is used for the bottom mirror (502).

The substrate (501) is preferably formed from any III-V semiconductor material or III-V semiconductor alloy, e.g., GaAs, InP, GaSb, or others. The preferred embodiment is a GaAs substrate.

Different designs for the bottom mirror (502) and the top mirror (516) are used, as described, e.g. in *Vertical-Cavity Surface-Emitting Lasers: Design, Fabrication, Characterization, and Applications* by C. W. Wilmsen, H. Temkin, L. A. Coldren (editors), Cambridge University Press, 1999. The preferred embodiments are a multi-layered dielectric mirror GaAs/AlGaO, a multi-layered semiconductor mirror GaAs/GaAlAs, or a multi-layered semiconductor mirror $Ga_{1-x}Al_xAs/Ga_{1-y}Al_yAs$.

The cavity (520) has two primary elements: 1) a photodetecting element (521) above the bottom mirror and 2) a phase control element (522) above the photodetecting element. To form the photodetecting element (521), a first current aperture (503) separates an n-doped current spreading layer (504) from the weakly n-doped layer (505). The n-doped current spreading layer (504) has a first metal contact (513). The photodetecting region (506) is sandwiched between a weakly n-doped layer (505) and a weakly p-doped layer (507). A second current aperture (503) separates the weakly p-doped layer (506) from the p-doped current spreading layer (508). The p-doped current spreading layer (508) has a second metal contact (514). The n-doped current spreading layer (504) preferably sits directly on top of the bottom mirror (502).

The photodetecting element (506) is preferably formed by any insertion, the energy band gap of which is less that the photon energy corresponding to the wavelength of light, for which the photodetector is designed, such that the light is absorbed by the photodetecting element. The photon energy and the wavelength are related by a standard formula:

$$E_{photon}(eV) = \frac{1.24}{\lambda(\mu m)}. \quad (7)$$

Possible embodiments include, but are not limited to, a single-layer or a multi-layer system of quantum wells, quantum wires, quantum dots, or any combination thereof. In a device on a GaAs-substrate, preferred embodiments include, but are not limited to, a system of insertions of InAs, $In_{1-x}Ga_xAs$, $In_xGa_{1-x-y}Al_yAs$, $In_xGa_{1-x}As_{1-y}N_y$, or similar insertions.

To form the phase control element (522), a weakly p-doped layer (509) is separated from the p-doped current spreading layer (508) by a third current aperture (503). The modulator (510) is surrounded by the weakly p-doped layer (509) and the weakly n-doped layer (511). The fourth current aperture (503) separates the n-doped layer (511) from a second n-doped current spreading layer (512). The second n-doped current spreading layer has a third metal contact (515). A distributed Bragg reflector is also preferably used for the top mirror (516) that is located on top of the phase control element. The n-doped current spreading layers (504) and (512) are preferably formed from the material lattice-matched or nearly lattice-matched to the substrate, transparent to the light in the given interval of wavelengths, for which the photodetector is designed, and doped by donor impurities. The preferred embodiment for this layer is the same material as that of the substrate, for example GaAs. Possible donor impurities include, but are not limited to, S, Se, or Te, and amphoteric impurities like Si, Ge, or Sn. The latter are introduced under such technological conditions that they are incorporated predominantly into the cation sublattice and serve as donor impurities.

The p-doped current spreading layer (508) is preferably formed from a material lattice-matched or nearly lattice-matched to the substrate, is transparent to the light in the given interval of wavelengths, for which the photodetector is designed, and doped by acceptor impurities. The preferred embodiment for this material is the same material as the substrate, for example, GaAs. Possible acceptor impurities include, but are not limited to, Be, Mg, Zn, Cd, Pb, or Mn, and amphoteric impurities like Si, Ge, or Sn. The latter are introduced under such technological conditions that they are incorporated predominantly into the anion sublattice and serve as acceptor impurities.

The metal contacts (513), (514), and (515) are preferably formed from multi-layered metal structures. Contacts to the n-doped layers (513) and (515) are preferably formed from, but are not limited to, the structure Ni—Au—Ge. Contacts to the p-doped layer (514) are preferably formed from, but are not limited to, the structure Ti—Pt—Au.

The modulator (510) is preferably formed by any insertion, the energy band gap of which is narrower than the energy band gap of the substrate. Possible materials and structures are preferably the same as those for the photodetecting element. However, the particular design should be such that the modulator exhibits a strong absorption peak on a high-energy side (on a shorter wavelength side) from the wavelength of the light, for which the photodetector is designed.

The photodetecting element (521) operates under a reverse bias (517), which is typical for photodetectors. An additional novel phase control element (522) operates under a reverse bias (518). The light comes in (537) through the top mirror (516).

Each layer is separated from the neighboring layer by a current aperture (503) that works as a current blocking layer. The current apertures (503) are preferably formed from, but are not limited to, an Al(Ga)O layer or a proton bombardment layer.

The photodetector in FIG. 5 preferably operates as follows. The electric field created by the reverse bias (518) is applied mainly to the undoped or weakly doped region, which includes the layers (509), (510), and (511). The modulator (510) is chosen to have a strong electrooptical effect. The refractive index of the modulator (510) is tuned under an external electric field controlled by the bias (518). The resonant wavelength of the cavity (520) is determined by the oscillation condition (H. C. Casey, Jr., and M. B. Panish, *Heterostructure Lasers*, Part A, Academic Press, N.Y. 1978). The optical path of the electromagnetic wave includes the layer (504), the first current aperture (503), the layer (505), the photodetecting layer (506), the layer (507), the second current aperture (503), the layer (508), the third current aperture, the layer (509), the modulator (510), the layer (511), the fourth current aperture, and the layer (512). All paths are doubled due to reflection from both the bottom and the top mirrors. A variation of the refractive index in the modulator (510), affects, first, the optical path of the light through the modulator, and, second, the transmission coefficient of the light from the layer (509) (or (511)) into the modulator (510) and back from the modulator (510) into the layer (509) (or (511)). The effect of the modulation of the resonant wavelength of the photodetector is further discussed below, in the description of FIGS. 7 through 12. The light (537) having a resonant wavelength is absorbed by the photodetecting element (506) and results in a photocurrent, which is measured by the milliampermeter (519).

In an alternative embodiment, a different sequence of contacts is used. The phase control element includes the n-contact layer, an undoped or weakly doped layer, inside which a modulator is inserted, and the p-contact layer. In this embodiment, the p-contact layer of the active element and the n-contact layer of the phase control element are separated by a $p^+n^+$ Esaki tunnel junction.

Another embodiment of the present invention allows an enhancement of the wavelength modulation effect in a wavelength tunable resonant photodetector. If a wavelength tunable resonant photodetector is grown on a substrate formed of GaAs, GaAlAs, or another material, lattice-matched or nearly lattice-matched to GaAs, the device may include layers of $Ga_{1-x}Al_xAs$ with a high aluminum content, preferably x>0.93, or layers of pure AlAs. Such layers can, after the structure has been grown epitaxially, be subject to oxidation, in which AlAs layers transform to AlO layers, and GaAlAs layers with a high aluminum content transform to GaAlO layers. AlO and GaAlO layers are dielectric layers with a refractive index significantly lower than the refractive index of GaAs or GaAlAs. When a layer of AlO (GaAlO) is inserted into a GaAs/GaAlAs multilayered structure, the electric field strength of the optical mode of the cavity decreases in the AlO (GaAlO) layer and increases in the neighboring layer. Thus, if an AlO (GaAlO) layer is introduced adjacent to the modulator, the electric field of the optical mode in the modulator increases, which leads to an enhancement of the resonant wavelength modulation effect.

Figure 6:
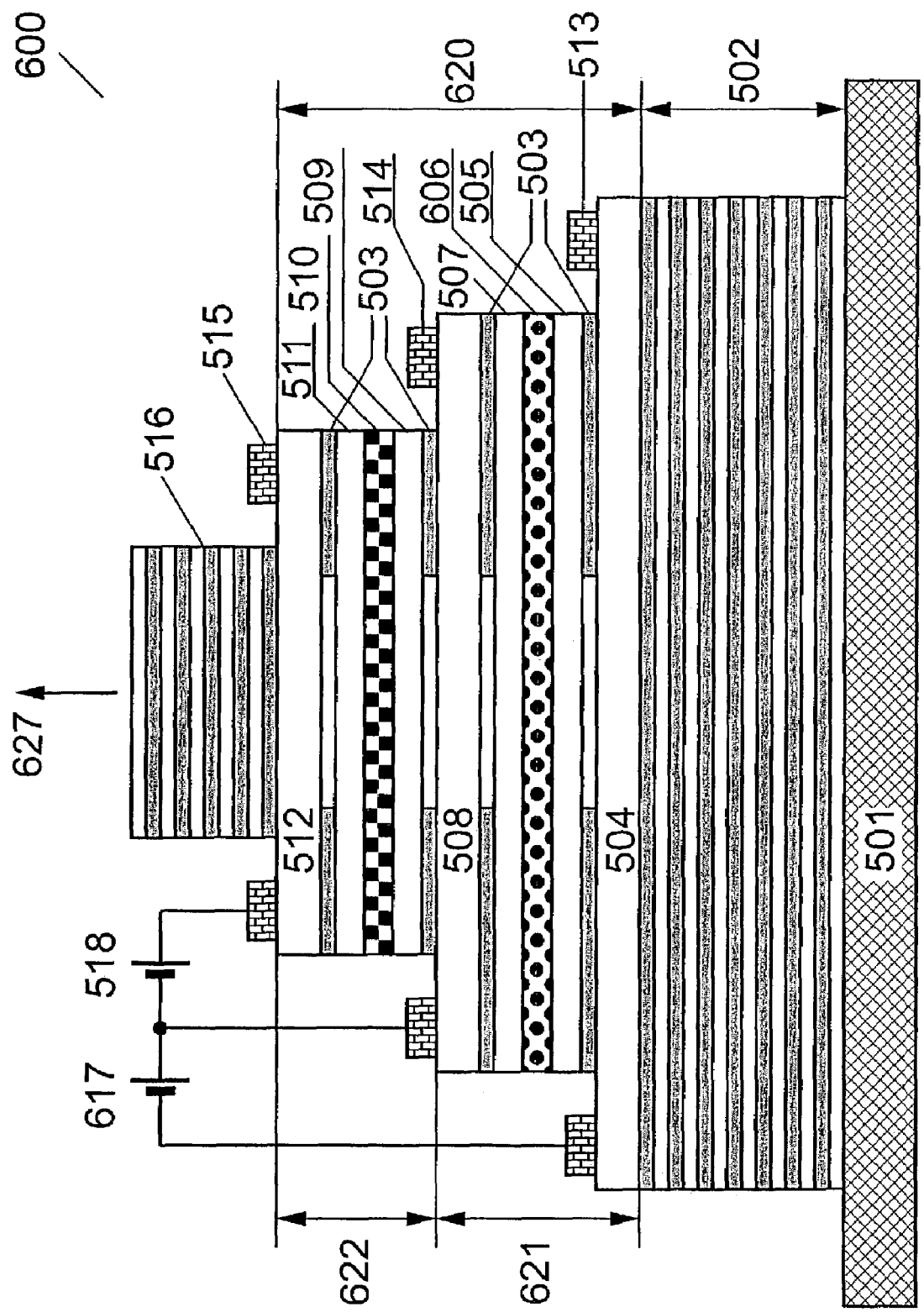
FIG. 6 shows a schematic illustration of a wavelength tunable semiconductor vertical cavity surface emitting laser operating as a part of a wavelength division multiplexing system according to the present invention.

FIG. 6 shows schematically a wavelength tunable laser (600), which is a part of a wavelength division multiplexing system according to the present invention. In particular, FIG. 6 shows a wavelength tunable vertical cavity surface-emitting laser (VCSEL). The wavelength tunable VCSEL (600) is grown epitaxially on a substrate (501). The VCSEL includes a bottom mirror (502), a cavity (620), and a top mirror (516). The cavity (620) includes an active element (621) and a phase control element (622). The active element (621) is formed, in general, similarly to the photodetecting element (521) of the photodetector (500) shown in FIG. 5, but operates under a forward bias (617). A current is injected into the active region (606) under a forward bias (617), and light is generated. The modulator (510) is chosen to have a strong electrooptical effect. The refractive index of the modulator (510) is tuned under an external electric field controlled by the bias (518). The selection of the emission wavelength from the gain region of the optical spectrum is determined by the oscillation condition for the cavity (620). Tuning the refractive index of the modulator (510) results in a change of the resonant wavelength of the cavity (620). Consequently, the wavelength of the laser light (627) emitted by the wavelength tunable VCSEL (600) also changes.

Another embodiment allows an enhancement of the wavelength modulation effect in a wavelength tunable vertical cavity surface emitting laser (VCSEL), which is a part of the wavelength division multiplexing system of the present invention. If a wavelength tunable VCSEL is grown on a substrate formed of GaAs, GaAlAs, or another material, lattice-matched or nearly lattice-matched to GaAs, the device may include layers of $Ga_{1-x}Al_xAs$ with a high aluminum content, preferably x>0.93, or layers of pure AlAs. Such layers can, after the structure has been grown epitaxially, be subject to oxidation, in which AlAs layers transform to AlO layers, and GaAlAs layers with a high aluminum content transform to GaAlO layers. AlO and GaAlO layers are dielectric layers with a refractive index significantly lower than the refractive index of GaAs or GaAlAs. If a layer of AlO (GaAlO) is inserted into a GaAs/GaAlAs multilayered structure, the electric field strength of the optical mode of the cavity decreases in the AlO (GaAlO) layer and increases in the neighboring layer. Thus, if the AlO (GaAlO) layer is introduced adjacent to the modulator, the electric field of the optical mode in the modulator increases, which leads to an enhancement of the modulation of the wavelength of the emitted laser light.

A general feature of the wavelength tunable resonance photodetector in FIG. 5 and the wavelength tunable vertical cavity surface emitting laser in FIG. 6 is the capability to tune the resonance wavelength of an optical cavity. The tuning mechanism is based on the ability to achieve a significant shift of the resonant cavity wavelength using quantum confines Stark effect in a microcavity.

Figure 7:
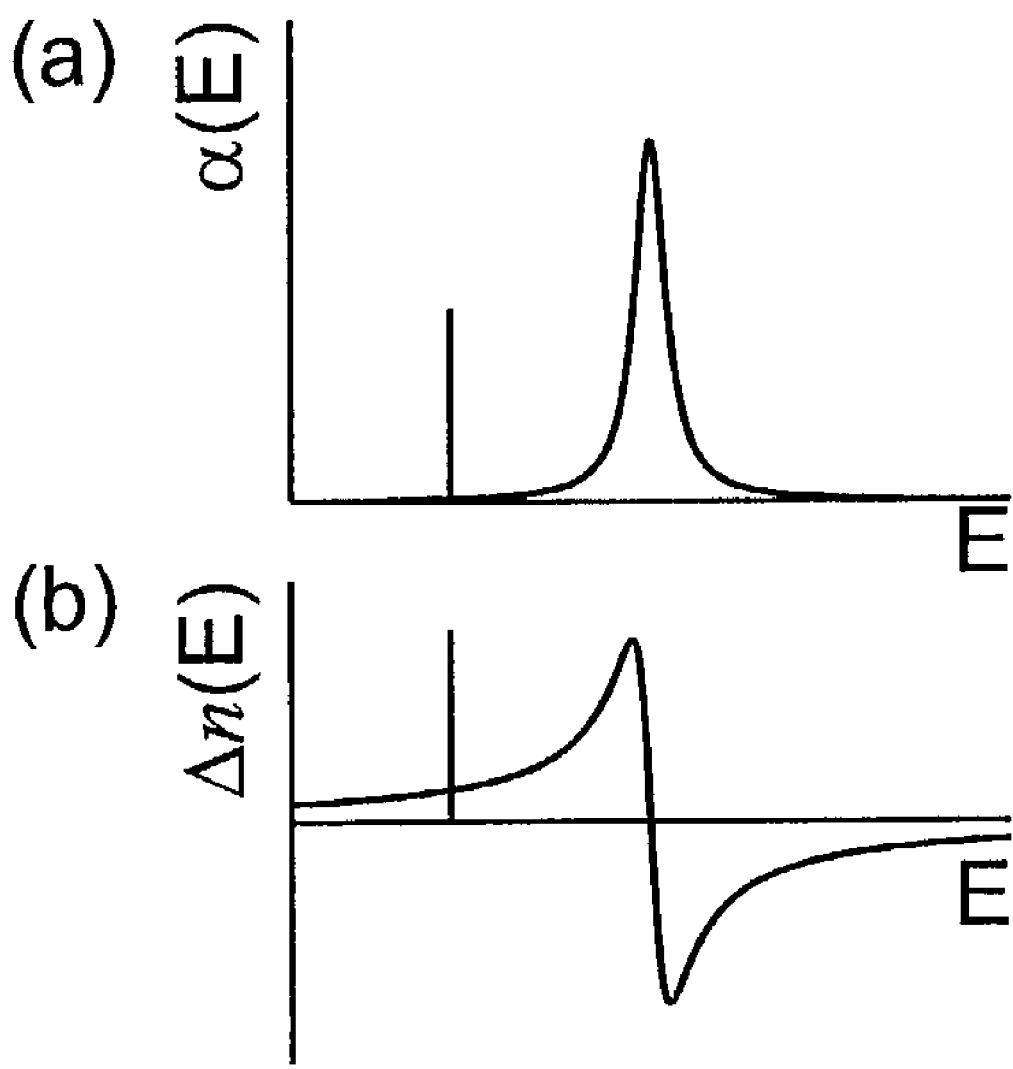
FIG. 7(a) shows a resonant absorption peak due to an exciton resonance in a quantum well.
FIG. 7(b) shows a modulation of the refractive index induced by the absorption peak.

Any absorption peak (for example exciton resonance absorption in a quantum well) causes a significant resonant modulation of the refractive index, as is qualitatively shown in FIG. 7. This modulation is related to an interconnection between real and imaginary parts of dielectric susceptibility for the real and imaginary part of the dielectric function $\in(\omega)=\in'(\omega)+i\in''(\omega)$ described by Kramers-Kronig relations, $$\varepsilon'(\omega) = \varepsilon_0 + \frac{1}{\pi} P \int \frac{\varepsilon''(\Omega)}{\Omega - \omega} d\Omega, \qquad (8)$$

where $\epsilon_0$ is the background dielectric constant, and P is the principal value of the integral.

Figure 8:
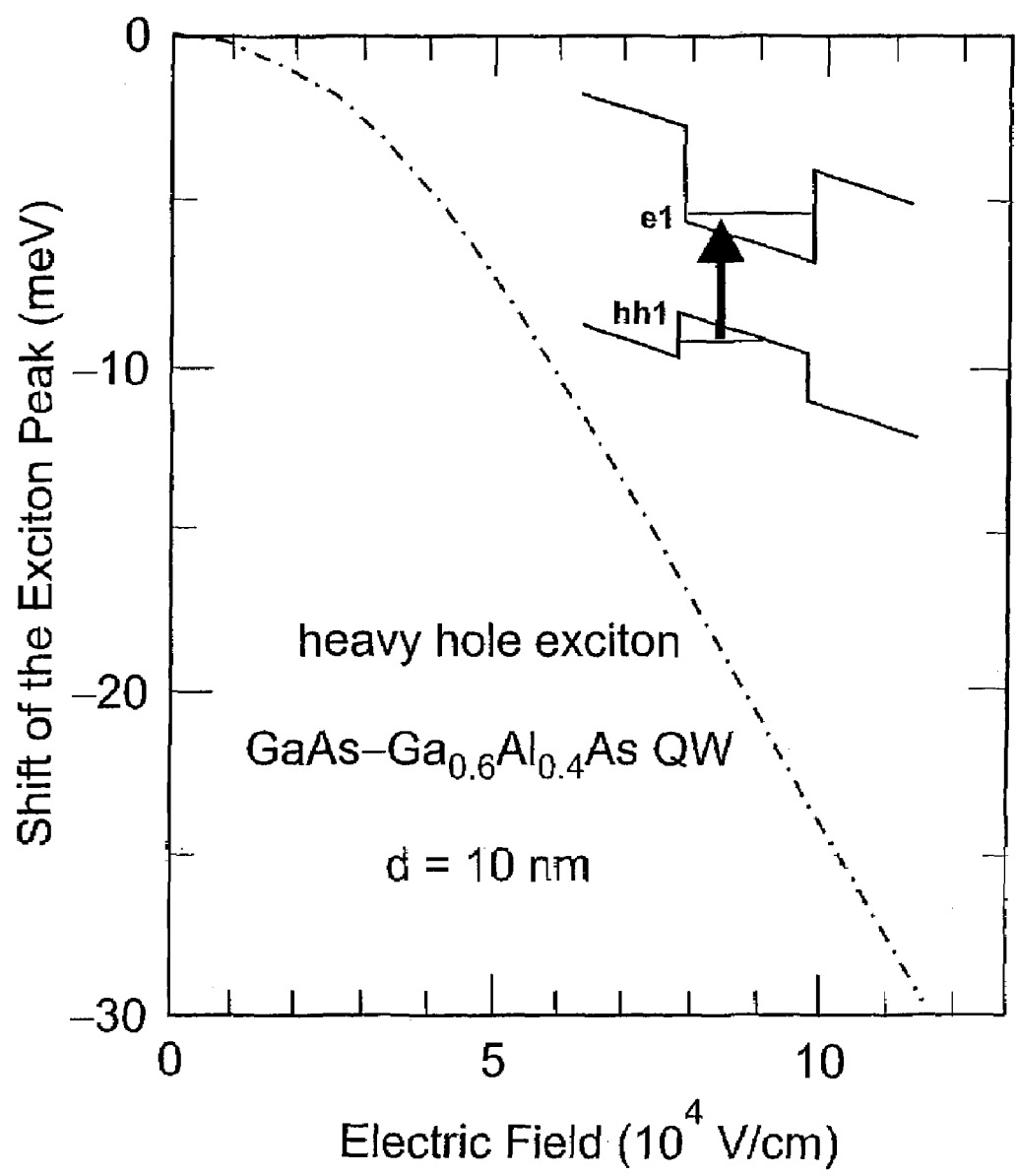
FIG. 8 shows a heavy-hole exciton absorption shift as a function of an applied electric field. A bandgap diagram under an applied electric field is shown in the insert.

The strongest resonant modulation of the refractive index takes place near the exciton resonance energy and smoothly decays away from the resonance $\sim 1/(E_0-E)$. In contrast, absorption decays much more quickly: $\sim 1/(E_0-E)^2$ in a case of a Lorentzian lineshape of the absorption peak. By applying voltage, for example, in a reverse biased p-n junction, one may shift electron and hole levels in a quantum well (QW) placed in an electric field, causing the shift of the exciton absorption resonance and modulating the refractive index at particular energy. An exciton absorption energy shift against applied electric field calculated for a 10 nm-thick GaAs-$Al_{0.4}Ga_{0.6}As$ quantum well using material parameters described in the paper by S. Adachi ("GaAs, AlAs, and $Al_x/Ga_{1-x}As$: *Material parameters for use in research and device applications*" J. Appl. Phys. Vol. 58, pp. R1–R29 (1985)) is shown in FIG. 8. The exciton oscillator strength decreases upon an increase of the applied electric field. However, this decrease is not significant for 7–10 nm well widths and peak shifts of 10–20 meV at 100 kV/cm electric fields, as shown by Y. P. Feng et al. ("*Exciton Energies as a Function of Electric Field: Confined Quantum Stark Effect*", Physical Review B. Vol. 48, 1963–1966 (1993)).

The time response, or the so-called Quantum Confinement Stark Effect (QCSE), is not limited by the radiative recombination rate, and ultrahigh modulation speed can be realized.

Introducing a resonant absorption peak may affect the cavity mode photon energy. If energies of the Fabri-Pérot (FP) photon mode of the cavity and the exciton electronic mode are in resonance or close to resonance, these two modes are no longer eigenstates of the system. Both states are strongly coupled and cavity polaritons occur. Experimental observation and modeling of the cavity polariton has been performed by R. Houdré et al. ("*Room-temperature cavity polaritons in a semiconductor microcavity*", Physical Review B. Vol. 49, issue 23, pp. 16761–16764 (1994)) who studied a GaAs $3/2\lambda$-microcavity on GaAs surrounded by $Ga_{1-x}Al_xAs/AlAs$ (x=0.10) distributed DBRs. The bottom DBR had 19 pairs of $0.25\lambda$-layers, and the top DBR had 15 pairs. Two insertions, each with three 75 Å InGaAs (13% In) quantum wells separated by 100 Å GaAs barriers, were introduced at ⅓ and ⅔ of the cavity thickness. The absorption (A) spectrum was deduced from reflectivity (R) and transmission (T) measurements. The absorption is defined as:

$$A = 1 - R - T. \qquad (8)$$

Moreover, for an asymmetric structure, at resonance T<<R, then A≈1−R. Optical properties of quantum well insertions may be described by a Lorentz oscillator dispersive dielectric constant:

$$\varepsilon(E) = n(E)^2 = \varepsilon_\infty + \frac{fq^2\hbar^2}{m\varepsilon_0 L_z} \frac{1}{E_0^2 - E^2 - i\gamma E}. \qquad (9)$$

Here f is the oscillator strength per unit area, q is the charge of the electron, m is the mass of the electron in vacuum, $L_z$ is the quantum well thickness, $\hbar$ is the Planck constant, $\epsilon_0$ is the vacuum dielectric constant, $E_0$ is the exciton energy, and $\gamma$ is the exciton linewidth. The measured absorption spectrum of a quantum well at temperature 77K was fit by Eq. (9) by Houdré et al. From the fit, the oscillator strength $f=4.8\times10^{12}$ cm$^{-2}$ and the linewidth y=2.7 meV is deduced.

The present inventors performed similar calculations, for a $1\lambda$-cavity, in which one insertion including three quantum wells is inserted at 0.5 of the cavity thickness. The DBR-FP structure was modeled by a standard transfer matrix method, and a 2D exciton is included with a dielectric constant from Eq.(2). Calculations were performed for different detunings between the exciton energy and the photon energy in the cavity mode, $$\Delta = E_0 - E_{cav}. \qquad (10)$$

Houdré et al. only considered the basic effect of the exciton photon coupling in a cavity giving a fixed splitting of the cavity mode via interaction with the exciton. Houdré et al. did not mention or study the wavelength tunability. Houdré et al. did not provide any guidance on how to achieve a wavelength tunability. Moreover, Houdré et al. did not explain how to make a tunable VCSEL or a tunable resonance cavity photodetector. Furthermore, Houdré et al. did not mention wavelength division multiplexing systems.

In contrast, the present invention discloses a wavelength-tunable vertical cavity surface emitting laser based on a cavity position-dependent electrooptical defect. The present invention also discloses a wavelength-tunable resonant cavity photodetector and an intelligent wavelength division multiplexing system based on arrays of wavelength-tunable lasers and wavelength-tunable resonance photodetectors.

In addition, the present invention shows how wavelength tunability may be enhanced by adjusting the cavity length, the type of the mirrors, the number of quantum wells or the number of quantum dot layers inserted into the cavity. The present invention demonstrates the feasibility of fabricating a wavelength-tunable laser and wavelength-tunable resonance photodetector, allowing a wavelength shift up to 9 nm.

Figure 9:
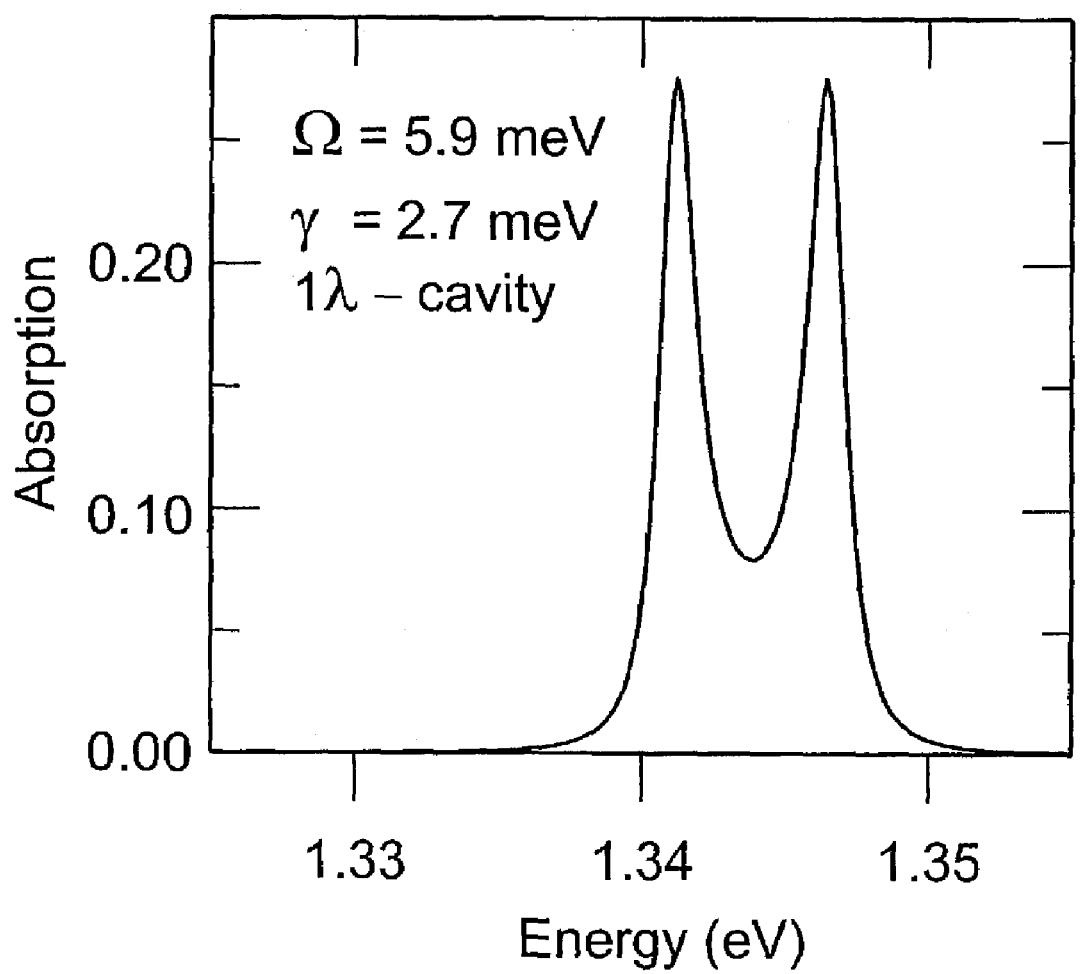
FIG. 9 shows a polariton effect in a semiconductor microcavity.

FIG. 9 shows the absorption spectrum in resonance. The calculated absorption spectrum at resonance for the $1\lambda$-cavity, a single three-quantum well insertion in the middle of the cavity, and mirrors, are the same as in R. Houdré et al. The calculation gives cavity mode splitting of 5.9 meV, essentially similar to the Houdré et al. results.

Figure 10:
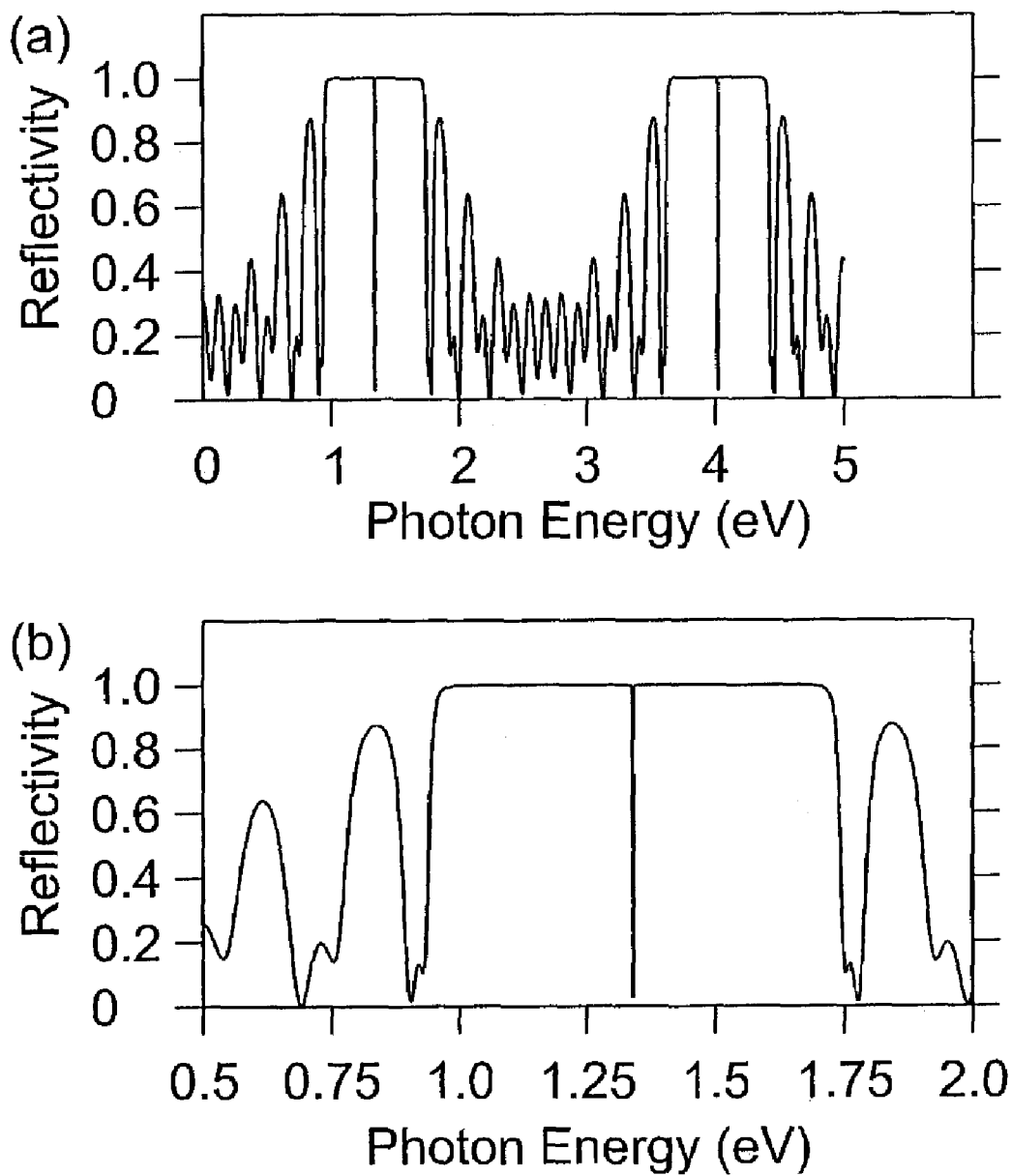
FIG. 10(a) shows a reflectivity spectrum of a GaAs 0.5λ-cavity surrounded by high-contrast GaAs/AlO DBRs.
FIG. 10(b) shows a reflectivity spectrum at a higher magnification, showing one stop-band in more detail.

To increase the splitting $\Omega$ between the two spectral lines in resonance, an embodiment of the present invention includes a cavity with high contrast GaAs/AlO DBRs, where layers have refractive indices (at the wavelength $\lambda=921.5$ nm) of 3.54 and 1.58, respectively. The structure includes five pairs GaAs/AlO in the bottom DBR and four pairs GaAs/AlO in the top DBR. The reflectivity spectrum of the structure is depicted in FIG. 10, showing repeated wide stop-bands. GaAs absorption at photon energies above 1.42 eV is not taken into account, to focus on resonant properties of cavity and DBRs. The structure is calculated to have a resonance at the wavelength 921.5 nm (photon energy 1.341 eV). Calculations of the reflectivity are performed under assumed constant refractive indices of 3.54 and 1.58 of GaAs and AlO, respectively.

FIGS. 11(a) through (e) show the effect of the cavity length on the splitting between two optical modes at resonance for four different cavities (the polariton effect). The effect is calculated for $0.5\lambda$-, $1\lambda$-, $1.5\lambda$-, and $2\lambda$-cavities of GaAs surrounded by five pairs of GaAs/AlO mirrors and four pairs of GaAs/AlO mirrors. There is a decrease in splitting with an increase in cavity length.

FIG. 11(a) shows the shortest ($0.5\lambda$) cavity (1110) bounded by the bottom mirror (1111) and the top mirror (1112). Only one period of each DBR is shown. A modulator (1113), which is a thin insertion including multiple layers of quantum wells, is introduced close to the maximum electric field strength of the cavity mode. The modulator (1113) is located close to a maximum of the electric field strength of the standing electromagnetic wave (1115) in the cavity. Such a short cavity reveals the maximum splitting due to the maximum overlap of the insertion and the optical mode, which equals 11.2 meV as illustrated in FIG. 11(b).

FIG. 11(c) shows a $1\lambda$-cavity (1120), where the modulator (1113) is located at the maximum of the electric field strength of the standing electromagnetic wave (1125). For a $1\lambda$ cavity, oxidized GaAs—Al(Ga)O DBRs give significantly larger splitting (8.9 meV) as compared to AlAs—GaAs DBRs (5.9 meV).

FIG. 11(d) shows a $1.5\lambda$-cavity (1130), where the modulator (1113) is located at one of the maxima of the electric field strength of the standing electromagnetic wave (1135). The splitting 7.5 meV is lower than in the $0.5\lambda$- and $1\lambda$-cavities.

Figure 11:
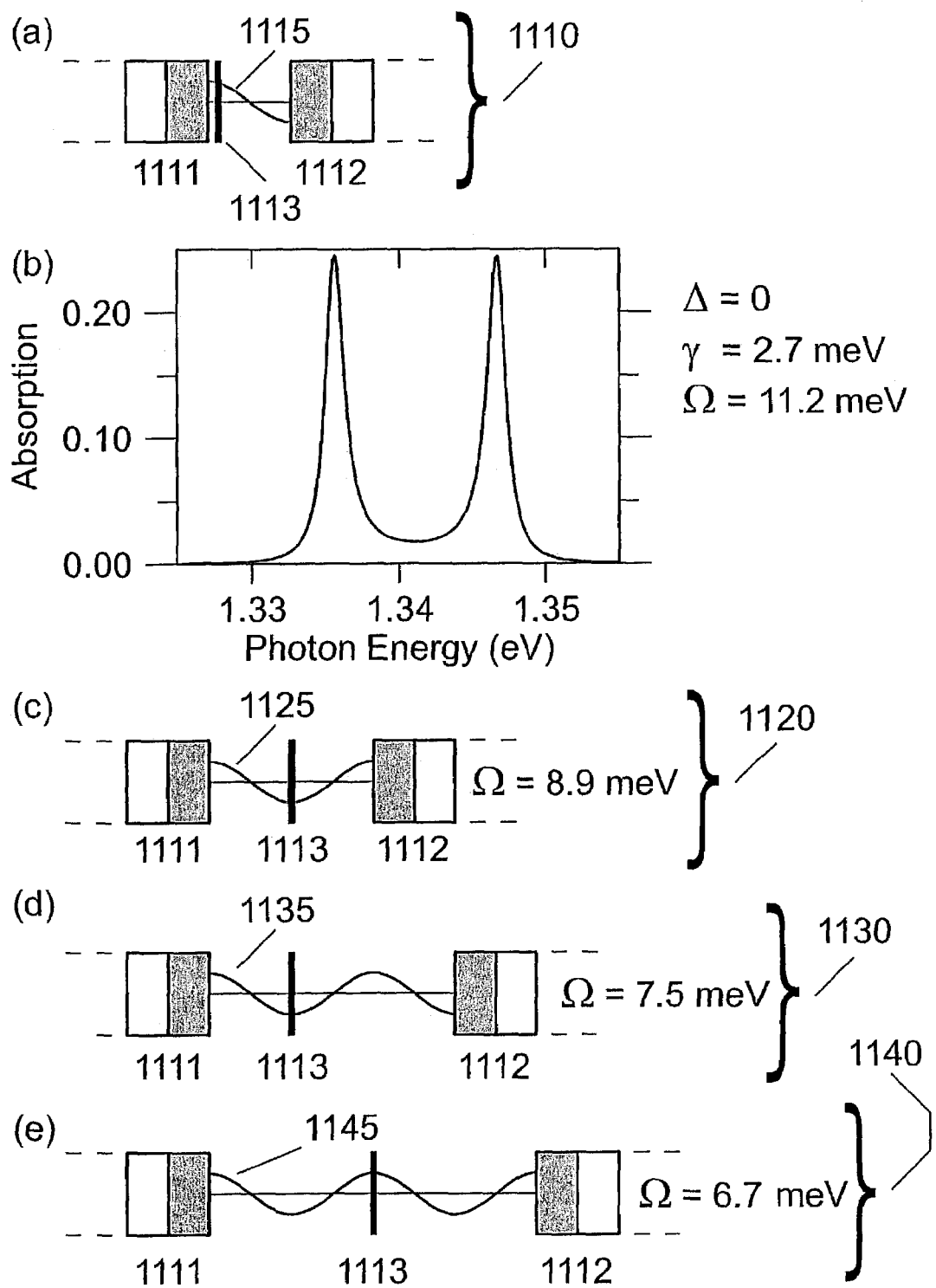
FIG. 11(a) shows a schematic view of a 0.5λ-cavity surrounded by two DBRs.
FIG. 11(b) shows a calculated absorption spectrum of the given structure showing a symmetrically split resonance, the splitting being equal to 11.2 meV.
FIG. 11(c) shows a schematic view of a 1λX-cavity, surrounded by two DBRs, the electric field strength profile of the cavity mode, and the insertion.
FIG. 11(d) shows a schematic view of a 1.5λ-cavity, surrounded by two DBRs, the electric field strength profile of the cavity mode, and the insertion.
FIG. 11(e) shows a schematic view of a 2λ-cavity, surrounded by two DBRs, the electric field strength profile of the cavity mode, and the insertion.

FIG. 11(e) shows a $2\lambda$-cavity (1140), where the modulator (1113) is located at one of the maxima of the electric field strength of the standing electromagnetic wave (1145). The splitting 6.7 meV is the lowest among all cavities shown in FIG. 11.

It is important to evaluate the role of homogeneous and inhomogeneous broadening on the splitting of the modes. The effect is very weakly sensitive to the homogeneous broadening increase, which caused smaller dephasing time at room temperature. Change in the linewidth (full width at half maximum, FWHM) from 2.7 meV (77K) to 9.3 meV (300K) leads to a minor change in the splitting energy (a decrease from 11.2 to 8.9 meV). This means that temperature variations do not cause a significant change in the modulator performance for a range close to or above room temperature. This is illustrated in Table 1, which shows the effect of the oscillator strength on the resonant splitting of the $0.5\lambda$-cavity mode.

TABLE 1

| Oscillator strength, $cm^{-2}$ | Exciton linewidth, meV | Splitting, meV |
|---|---|---|
| $4.8 \times 10^{12}$ | 2.7 (77 K) | 11.2 |
| $4.8 \times 10^{12}$ | 9.3 (300 K) | 8.9 |
| $2 \times 4.8 \times 10^{12}$ | 9.3 | 14.5 |
| $3 \times 4.8 \times 10^{12}$ | 9.3 | 18.4 |
| $4 \times 4.8 \times 10^{12}$ | 9.3 | 21.6 |
| $5 \times 4.8 \times 10^{12}$ | 9.3 | 24.2 |

Using several thin quantum wells, one can dramatically increase the effects even further. The oscillator strength may be increased by a factor of five as compared to that of the paper by R. Houdré et al., if a multiple layer structure comprising five InGaAs quantum wells, each 50 Å thick, separated by 50 Å thick GaAs barriers, is inserted.

Figure 12:
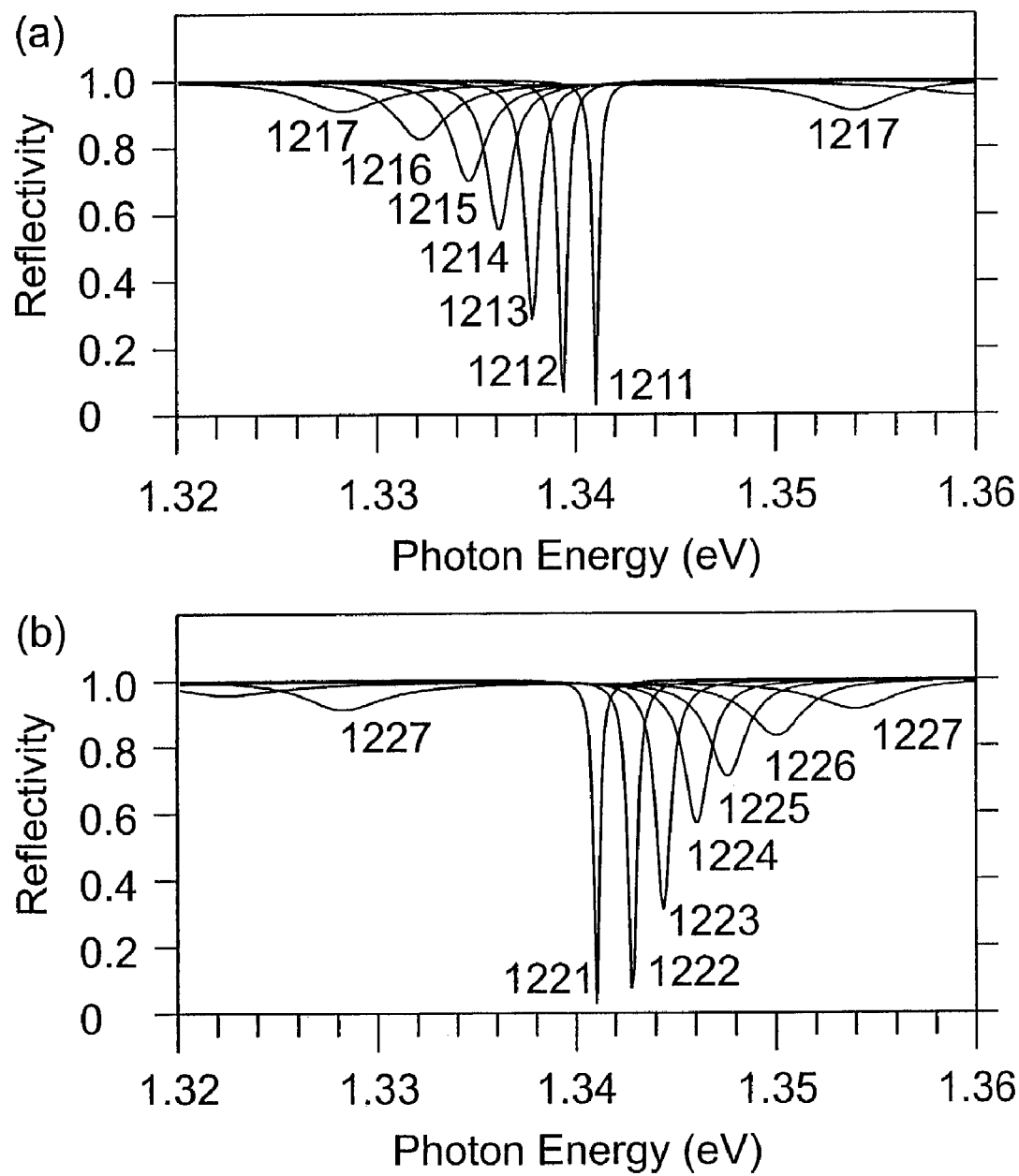
FIG. 12(a) shows an energy shift of a 0.5λ-cavity mode due to exciton-induced modulation of the refractive index.
FIG. 12(b) shows a reflectivity spectra calculated for different energy detuning between the exciton line and the cavity mode.

FIG. 12 shows the reflectivity spectrum of the cavity itself, and the cavity with a multiple quantum well insertion. FIG. 12(a) refers to the case where the exciton absorption peak is located at a higher energy side from the cavity mode. Reflectivity spectra are calculated for different energy detuning between the exciton line and the cavity mode. The exciton line is on a higher-energy side from the cavity mode. Table 2 shows the shift of the cavity mode due to polariton effect versus detuning. Curves (1211) through (1217) refer to different detuning values as given in Table 2. Curve (1211) is the reflectivity of a cavity without exciton effect. Curve (1212) represents detuning $\Delta=100$ meV. Curve (1213) represents detuning $\Delta=50$ meV. Curve (1214) represents detuning $\Delta=30$ meV. Curve (1215) represents detuning $\Delta=20$ meV. Curve (1216) represents detuning $\Delta=10$ meV. Curve (1217) represents exact resonance: $\Delta=0$.

FIG. 12(b) refers to the case where the exciton absorption peak is located at a lower energy side from the cavity mode. Curves (1221) through (1227) refer to different detuning values as given in Table 2. The exciton line is on a lower-energy side from the cavity mode. Curve (1221) represents the reflectivity of a cavity without exciton effect. Curve (1222) represents detuning $\Delta=-100$ meV. Curve (1223) represents detuning $\Delta=-50$ meV. Curve (1224) represents detuning $\Delta=-30$ meV. Curve (1225) represents detuning $\Delta=-20$ meV. Curve (1226) represents detuning $\Delta=-10$ meV. Curve (1227) represents exact resonance: $\Delta=0$.

TABLE 2

| Detuning $\Delta$, meV | Curve in FIG. 12 | Energy of the cavity mode, meV | Shift of energy, meV | Wavelength of the cavity mode $\lambda_{cav}$, nm | Shift of the wavelength $\Delta\lambda_{cav}$, nm | Absorption in quantum wells $\alpha$, $cm^{-1}$ |
|---|---|---|---|---|---|---|
| Cavity mode | (1211) and (1221) | 1341.0 | 0 | 921.5 | 0 | 0 |
| 100 | (1212) | 1339.4 | −1.6 | 922.6 | 1.1 | $5.54 \times 10^1$ |
| 50 | (1213) | 1337.8 | −3.2 | 923.7 | 2.2 | $2.07 \times 10^2$ |
| 30 | (1214) | 1336.2 | −4.8 | 924.8 | 3.3 | $4.84 \times 10^2$ |
| 20 | (1215) | 1334.6 | −6.4 | 925.9 | 4.4 | $8.32 \times 10^2$ |
| 10 | (1216) | 1332.2 | −8.8 | 927.6 | 6.1 | $1.59 \times 10^3$ |
| 0 (resonance) | (1217) | 1328.3 | −12.7 | 930.3 | 8.8 | $3.26 \times 10^3$ |
| 0 (resonance) | (1227) | 1353.9 | 12.9 | 912.7 | −8.8 | $3.43 \times 10^3$ |
| −10 | (1226) | 1350.0 | 9.0 | 915.4 | −6.1 | $1.68 \times 10^3$ |

TABLE 2-continued

| Detuning Δ, meV | Curve in FIG. 12 | Energy of the cavity mode, meV | Shift of energy, meV | Wavelength of the cavity mode $\lambda_{cav}$, nm | Shift of the wavelength $\Delta\lambda_{cav}$, nm | Absorption in quantum wells α, cm$^{-1}$ |
|---|---|---|---|---|---|---|
| −20 | (1225) | 1347.6 | 6.6 | 917.0 | −4.5 | 8.81 × 10$^2$ |
| −30 | (1224) | 1346.0 | 5.0 | 918.1 | −3.4 | 5.25 × 10$^2$ |
| −50 | (1223) | 1344.4 | 3.4 | 919.2 | −2.3 | 2.27 × 10$^2$ |
| −100 | (1222) | 1342.8 | 1.8 | 920.3 | −1.2 | 6.48 × 10$^1$ |

It is important to achieve significant wavelength shift, and simultaneously not to have strong absorption at the cavity wavelength for the device to operate properly. The prior art assumed that the two conditions are nearly impossible to satisfy simultaneously. However, the present invention shows that this is not the case. Table 2 summarizes the values of the shift and the absorption values. For the vertical cavity surface emitting laser, material gain in quantum wells is about 10$^3$ cm$^{-1}$, and the losses for the quantum well—VCSEL must stay well below this value.

Table 2 shows that 5–6 meV (4–5 nm) shifts are possible via quantum confined Stark effect without too strong of an enhancement of the cavity absorption. For the wavelength in the 1.3–1.6 μm spectral range, a similar energy shift causes a much larger wavelength shift (8 to 9 nm).

For very large energy separations between the absorption peak and the nominal cavity mode energy, when the absorption is just negligible (material absorption in the modulator region is few tens cm$^{-1}$ for 100 meV energy difference), one can further enhance the exciton oscillator strength to increase the range of wavelength tuning. If the oscillator strength is further increased by a factor of 2, the value of the shift approximately doubles. Table 3 shows the effect of the enhanced oscillator strength on the shift of the cavity mode. Although the losses also double, they remain too low to affect lasing characteristics significantly. Thus, even for a large energy separation, ~100 meV, a significant wavelength tuning range can be realized.

TABLE 3

| Oscillator strength, cm$^{-2}$ | Detuning Δ, meV | Energy of the cavity mode, meV | Shift of energy, meV | $\lambda_{cav}$, nm | $\Delta\lambda_{cav}$, nm | α, cm$^{-1}$ |
|---|---|---|---|---|---|---|
|  | Cavity | 1341.0 | 0 | 921.5 | 0 | 0 |
| 2.4 × 10$^{13}$ | 100 | 1339.4 | −1.6 | 922.6 | 1.1 | 5.54 × 10$^1$ |
| 4.8 × 10$^{13}$ | 100 | 1337.8 | −3.2 | 923.7 | 2.2 | 1.03 × 10$^2$ |

A further increase in the tuning efficiency may be realized by using optimum design of the cavity to increase the strength of the electric field in the modulator region. In an embodiment of the present invention, the modulator region is sandwiched between AlO layers. To ensure efficient collection of photogenerated carriers, very small apertures in the oxide cladding are used. In another embodiment of the present invention, one intracavity contact in combination with oxide layers overlapping in the modulator part is used.

Thus, the energy of the cavity modes can be shifted by the value up to 5–6 nm, and the proposed mechanism of the tuning of the cavity wavelength can indeed be used in wavelength tunable lasers and wavelength tunable resonant photodetectors. In another embodiment, the modulator region is sandwiched between GaAlO layers.

Another opportunity to modulate the refractive index is to apply forward bias. In this case, application of an electric field is limited by injection of nonequilibrium carriers. However, the injected carriers cause exciton absorption bleaching through exciton screening by free carriers and by Fermi space filling of the available electron and hole states. The absorption peak vanishes and, thus, the refractive index is strongly modified. The time response is limited by the quantum well depletion time due to radiative recombination or carrier tunneling through barriers if strong reverse bias is applied after the current-injection pulse, as shown in Y. Chiba et al. ("*Resonance-state calculation applying Weyl-Titchmarsh theory: Application for the quantum-confined Stark effects on excitons in a GaAs—Al$_x$Ga$_{1-x}$As quantum well*", Physical Review B, Vol. 41, pp. 6065–6068 (1990)).

Thus, in another embodiment, a wavelength tunable vertical cavity surface emitting laser includes a phase control element and a modulator, which operates under a forward bias. In this embodiment, an effect of exciton absorption bleaching modulates the refractive index.

In another embodiment, a wavelength tunable resonant photodetector includes a phase control element and a modulator, which operates under a forward bias. In this embodiment, an effect of exciton absorption bleaching is used to modulate the refractive index.

In yet another embodiment, micromechanical modulation of the position of an external mirror tunes the length of a cavity and thus tunes the resonant wavelength of the cavity.

In a preferred embodiment, the micromechanical modulation is used to tune the wavelength of the laser light emitted by a wavelength tunable vertical cavity surface emitting laser. In another preferred embodiment, the micromechanical modulation is used to tune the resonant wavelength of a wavelength tunable resonant photodetector.

In another embodiment, the piezoelectric effect is used to tune the resonant wavelength of a cavity. The cavity includes a layer formed of a material exhibiting a strong piezoelectric effect. Applying a control voltage to this layer results in a deformation of the layer and in a corresponding change in its thickness. Thus, the length of the cavity changes; hence the resonant wavelength of the cavity changes as well. In a preferred embodiment, the piezoelectric effect is used to tune the wavelength of the laser light emitted by the wavelength tunable vertical cavity surface-emitting laser. In another preferred embodiment, the piezoelectric effect tunes the resonant wavelength of a wavelength tunable resonant photodetector.

The wavelength tunable resonant photodetector in FIG. 5 and the wavelength tunable laser in FIG. 6 are vertical cavity optoelectronic devices. Another embodiment of the present invention is a wavelength tunable tilted cavity laser made according to a general concept of a tilted cavity laser described in the paper by N. N. Ledentsov and V. A. Shchukin, "Novel Concepts for Injection Lasers", Optical Engineering, Vol. 41 (12), pp. 3193–3203 (2002). Briefly, a tilted cavity laser is preferably designed such that a cavity is sandwiched between a bottom mirror and a top mirror. Both mirrors are preferably designed as multilayered mirrors. The major difference between a VCSEL and a TCL is that both the cavity and the mirrors in a TCL are in resonance to an optical mode, which propagate at a certain angle θ to the normal to the mirror planes.

There are many advantages to a tilted cavity laser. First, a tilted cavity laser may be used as both a surface emitting laser and an edge emitting laser. Second, the resonant conditions for the cavity and the mirrors are independent, thus providing a selection of both the angle θ and the wavelength of the emitted laser light. Third, the reflectivity of a tilted mode from a multilayered mirror is significantly higher than that of a vertical mode, which allows the device to reach the same high finesse of the cavity by using a mirror having a smaller number of layers and a smaller total thickness. Fourth, when a tilted cavity laser is used as a surface emitting laser, one of the preferred embodiments is such that the angle θ exceeds the angle of the total internal reflectance at the boundary between the semiconductor material of a cavity and the vacuum, and the emitted laser light is directly coupled via the near field to an optical fiber. This significantly reduces diffraction losses at the coupling to a fiber. Fifth, when a tilted cavity laser is used as an edge-emitting laser, it provides a strong wavelength stabilization of the emitted laser light.

In an embodiment of the present invention, a tilted cavity includes additionally a phase control element, which modulates the wavelength of the laser light emitted by the laser. In a preferred embodiment, the wavelength tunable resonant photodetector is a tilted cavity resonant photodetector.

In another embodiment, a wavelength division multiplexing system includes a wavelength tunable edge-emitting laser. The wavelength tunable edge-emitting laser includes a section, in which a distributed feedback is used for the stabilization of the wavelength of the emitted laser light and for the selection of a single longitudinal mode in the laser light. Using a modulator in such a laser allows it to be applied to the wavelength division multiplexing system of the present invention.

In another embodiment, the wavelength division multiplexing system includes wavelength tunable resonant photodetectors operating in the edge geometry, where the resonance is provided by a section using a distributed feedback. Using a modulator in such a photodetector allows it to be used in the wavelength division multiplexing system of the present invention.

One basic advantage of the wavelength division multiplexing system of the present invention is the ability to self adjust the resonant wavelength of each given resonant photodetector to the wavelength of the laser light emitted by the laser assigned to a given channel of data link. One of the embodiments of this self-adjustment is illustrated in FIGS. 1–3.

In another embodiment of the present invention, the adjustment of a resonant photodetector and a laser is carried out for each channel without using a reference laser and a reference photodetector. In this embodiment, the signal transmitted by a laser includes both a reference signal and a data transfer signal. These two signals can differ in amplitude or in pulse duration. The system tunes the wavelength of the corresponding reference photodetector until the reference signal registered by the photodetector reaches its maximum value. Then, the data transfer signal is registered at the same wavelength.

In another embodiment of the present invention, a wavelength division multiplexing system has both wavelength tunable lasers and wavelength tunable resonance photodetectors. In this embodiment, a laser of the first array emits laser light at a wavelength $\lambda^*$. A photodetector of the second array registers the laser light emitted by the corresponding laser of the first array. The photodetector of the second array transfers the information about the intensity I of the registered signal to the corresponding laser of the second array. The corresponding laser of the second array emits laser light sending information about the registered intensity back to the first array. A corresponding photodetector at the first array receives the information about the intensity I. The system tunes the wavelength of the laser light $\lambda^*$ emitted by the laser of the first array until the intensity I reaches its maximum value.

In another embodiment, arrays of optoelectronic devices located at different locations can establish a dialogue. In yet another embodiment, more than two arrays of optoelectronic devices, each array being located at its own location, form an intelligent network, allowing self-adjustment and various forms of dialogue. A preferred number of arrays are from three to one hundred.

In another embodiment, the control parameter U controlling the wavelength of a wavelength tunable laser is modulated such that the laser light emitted by the laser is frequency-modulated. The signal detected by a corresponding resonance photodetector is then modulated in amplitude. This embodiment allows for high frequency operation.

In another embodiment, the active or passive mode-locking can be used to operate at high power. Optical bistabity in two-section devices with saturable absorber can be applied to allow logic functions of the elements.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A wavelength division multiplexing system comprising at least two arrays of optoelectronic devices, each being located at a different location, and a communication medium, wherein:
   a) a first array of optoelectronic devices is located at a first location and comprises a plurality of wavelength tunable lasers; and
   b) a second array of optoelectronic devices is located at a second location, different from the first location, and comprises a plurality of wavelength tunable resonant photodetectors;
   wherein the wavelength division multiplexing system is self-adjusted such that a wavelength of laser light emitted by at least one of the wavelength tunable lasers is set to match a resonance wavelength of at least one of the wavelength tunable resonant photodetectors.

2. The wavelength division multiplexing system of claim 1, wherein the first array of optoelectronic devices comprises optoelectronic devices selected from the group consisting of:
   i) wavelength tunable lasers; and
   ii) wavelength tunable resonant photodetectors.

3. The wavelength division multiplexing system of claim 1, wherein the second array of optoelectronic devices comprises optoelectronic devices selected from the group consisting of:
   i) wavelength tunable lasers; and
   ii) wavelength tunable resonant photodetectors.

4. The wavelength division multiplexing system of claim 1, wherein the communication medium is selected from the group consisting of:
   a) an optical fiber;
   b) free space; and
   c) a semiconductor chip.

5. The wavelength division multiplexing system of claim 1, wherein the wavelength division multiplexing system is a part of a communication network selected from the group consisting of:
   a) a long-haul network;
   b) a metropolitan area network;
   c) a local area network;
   d) a storage area network;
   e) a plurality of computer optical interconnects; and
   f) an automobile data network.

6. The wavelength division multiplexing system of claim 1, further comprising a multiplexing element located at the first location wherein the multiplexing element directs laser light emitted by the wavelength tunable lasers to the communication medium.

7. The wavelength division multiplexing system of claim 1, further comprising a demultiplexing element located at the second location wherein the demultiplexing element directs laser light having a wavelength in a certain wavelength interval to a corresponding wavelength tunable resonant photodetector.

8. The wavelength division multiplexing system of claim 6, further comprising a demultiplexing element located at the second location wherein the demultiplexing element directs laser light having a wavelength in a certain wavelength interval to a corresponding wavelength tunable resonant photodetector.

9. The wavelength division multiplexing system of claim 1, wherein a wavelength of laser light emitted by at least one of the wavelength tunable lasers is controlled by a control parameter selected from the group consisting of:
   a) a voltage for the wavelength tunable laser using a quantum confined Stark effect;
   b) an injection current for the wavelength tunable laser using an effect of bleaching;
   c) a position of an external mirror for the wavelength tunable laser using micromechanical modulation of the wavelength; and
   d) a voltage for a wavelength tunable laser based on a piezoelectric effect, wherein an applied voltage tunes a width of a cavity of the wavelength tunable laser.

10. The wavelength division multiplexing system of claim 1, wherein a resonant wavelength of at least one of the wavelength tunable resonant photodetectors is controlled by a control parameter selected from the group consisting of:
   a) a voltage for the wavelength tunable resonant photodetector using a quantum confined Stark effect;
   b) an injection current for the wavelength tunable resonant photodetector using an effect of bleaching;
   c) a position of an external mirror for the wavelength tunable resonant photodetector using micromechanical modulation of the wavelength; and
   d) a voltage for the wavelength tunable resonant photodetector based on a piezoelectric effect, wherein applied voltage tunes a width of a cavity.

11. The wavelength division multiplexing system of claim 1, wherein the first array of optoelectronic devices comprises at least one reference wavelength tunable laser and at least one data communication wavelength tunable laser.

12. The wavelength division multiplexing system of claim 1, wherein the second array of optoelectronic devices comprises at least one reference wavelength tunable resonance photodetector and at least one data communication wavelength tunable resonance photodetector.

13. The wavelength division multiplexing system of claim 11, wherein the second array of optoelectronic devices comprises at least one reference wavelength tunable resonance photodetector and at least one data communication wavelength tunable resonance photodetector.

14. The wavelength division multiplexing system of claim 13, wherein the reference wavelength tunable laser and the reference wavelength tunable resonant photodetector form a reference communication channel.

15. The wavelength division multiplexing system of claim 14, wherein a plurality of data communication channels is formed, each of which comprises one data communication wavelength tunable laser and one data communication wavelength tunable resonant photodetector.

16. The wavelength division multiplexing system of claim 14, wherein the data communication wavelength tunable laser and the data communication wavelength tunable resonant photodetector form a data communication channel.

17. The wavelength division multiplexing system of claim 16, wherein a signal transferred in at least one data communication channel comprises:
   a) a reference part; and
   b) a data communication part.

18. The wavelength division multiplexing system of claim 17, wherein the reference part of the signal is larger in amplitude than the data communication part of the signal.

19. The wavelength division multiplexing system of claim 17, wherein the reference part of the signal differs from the data communication part of the signal in pulse duration.

20. The wavelength division multiplexing system of claim 16, wherein frequency modulation modulates a signal transmitted by a wavelength tunable laser in at least one data communication channel, such that a signal detected by a wavelength tunable resonant photodetector in the data communication channel is modulated in amplitude.

21. The wavelength division multiplexing system of claim 1, wherein:
 a) the first array of optoelectronic devices comprises:
  i) at least one wavelength tunable laser; and
  ii) at least one wavelength tunable resonant photodetector; and
 b) the second array of optoelectronic devices comprises:
  i) at least one wavelength tunable laser; and
  ii) at least one wavelength tunable resonant photodetector.

22. The wavelength division multiplexing system of claim 21, further comprising at least one dialog data communication channel, comprising:
 a) a wavelength tunable laser in the first array of optoelectronic devices;
 b) a wavelength tunable resonant photodetector in the first array of optoelectronic devices;
 c) a wavelength tunable laser in the second array of optoelectronic devices; and
 d) a wavelength tunable resonant photodetector in the second array of optoelectronic devices.

23. The wavelength division multiplexing system of claim 1, comprising more than two arrays of optoelectronic devices, each array being located at a different location, wherein the optoelectronic devices in the arrays are selected from the group consisting of:
 a) a wavelength tunable laser; and
 b) a wavelength tunable resonant photodetector; and
 c) any combination of a) and b).

24. The wavelength division multiplexing system of claim 23, wherein a number of the arrays of optoelectronic devices ranges from three to one hundred.

25. The wavelength division multiplexing system of claim 1, wherein at least one of the wavelength tunable resonant photodetectors comprises a wavelength tunable semiconductor vertical cavity resonance photodetector comprising:
 a) a substrate;
 b) a bottom mirror located above the substrate and formed by a Bragg reflector region;
 c) a cavity comprising:
  i) a photodetecting element located above the bottom mirror, comprising:
   A) a light absorption layer that generates photocurrent when light is absorbed;
   B) a first n-doped current spreading region located above the substrate and below the light absorption layer;
   C) a first p-doped current spreading region located above the light absorption layer;
   D) current apertures placed between each neighboring region; and
   E) a photodetecting element bias control device located between the n-doped current spreading region and the p-doped current spreading region, such that no photocurrent occurs when no light is absorbed; and
  ii) a phase control element located above the photodetecting element, comprising:
   A) a modulating layer located above the first p-doped current spreading region, wherein the modulating layer uses a position-dependent electro-optical effect to modulate a resonant wavelength of the cavity when exposed either to an electric field when a reverse bias is applied, or to an injection current when a forward bias is applied;
   B) a second n-doped current spreading region located above the modulating layer;
   C) current apertures placed between each neighboring region; and
   D) a phase control element bias control device located between the second n-doped current spreading region and the first p-doped current spreading region, such that an electrical field is created to cause the modulating layer to modulate the resonance wavelength of the cavity; and
 d) a top mirror located above the phase control element and formed by a Bragg reflector.

26. The wavelength division multiplexing system of claim 1, wherein at least one of the wavelength tunable resonant photodetectors comprises a wavelength tunable semiconductor vertical cavity resonance photodetector comprising:
 a) a substrate comprising a material selected from the group consisting of:
  i) GaAs;
  ii) GaAlAs alloy; and
  iii) another semiconductor material lattice matched or nearly lattice matched to GaAs;
 b) a bottom mirror located above the substrate and formed by a Bragg reflector region;
 c) a cavity comprising:
  i) a photodetecting element located above the bottom mirror, comprising:
   A) a light absorption layer that generates photocurrent when light is absorbed;
   B) a first n-doped current spreading region located above the substrate and below the light absorption layer;
   C) a first p-doped current spreading region located above the light absorption layer;
   D) current apertures placed between each neighboring region; and
   E) a photodetecting element bias control device located between the n-doped current spreading region and the p-doped current spreading region, such that no photocurrent occurs when no light is absorbed; and
  ii) a phase control element located above the photodetecting element, comprising:
   A) a modulating layer located above the first p-doped current spreading region, wherein the modulating layer uses a position-dependent electro-optical effect to modulate a resonant wavelength of the cavity when exposed either to an electric field when a reverse bias is applied, or to an injection current when a forward bias is applied;
   B) a second n-doped current spreading region located above the modulating layer;
   C) current apertures placed between each neighboring region; and
   D) a phase control element bias control device located between the second n-doped current spreading region and the first p-doped current spreading region, such that an electrical field is created to cause the modulating layer to modulate the resonance wavelength of the cavity;
 d) a top mirror located above the phase control element and formed by a Bragg reflector; and
 e) an additional dielectric layer adjacent to the modulating layer on an n-side, wherein the additional dielectric layer comprises a material selected from the group consisting of AlO, and GaAlO.

27. The wavelength division multiplexing system of claim 1, wherein at least one of the wavelength tunable resonant photodetectors comprises a wavelength tunable semiconductor vertical cavity resonance photodetector comprising:
   a) a substrate comprising a material selected from the group consisting of:
      i) GaAs;
      ii) GaAlAs alloy; and
      iii) another semiconductor material lattice matched or nearly lattice matched to GaAs;
   b) a bottom mirror located above the substrate and formed by a Bragg reflector region;
   c) a cavity comprising:
      i) a photodetecting element located above the bottom mirror, comprising:
         A) a light absorption layer that generates photocurrent when light is absorbed;
         B) a first n-doped current spreading region located above the substrate and below the light absorption layer;
         C) a first p-doped current spreading region located above the light absorption layer;
         D) current apertures placed between each neighboring region; and
         E) a photodetecting element bias control device located between the n-doped current spreading region and the p-doped current spreading region, such that no photocurrent occurs when no light is absorbed; and
      ii) a phase control element located above the photodetecting element, comprising:
         A) a modulating layer located above the first p-doped current spreading region, wherein the modulating layer uses a position-dependent electro-optical effect to modulate a resonant wavelength of the cavity when exposed either to an electric field when a reverse bias is applied, or to an injection current when a forward bias is applied;
         B) a second n-doped current spreading region located above the modulating layer;
         C) current apertures placed between each neighboring region; and
         D) a phase control element bias control device located between the second n-doped current spreading region and the first p-doped current spreading region, such that an electrical field is created to cause the modulating layer to modulate the resonance wavelength of the cavity;
   d) a top mirror located above the phase control element and formed by a Bragg reflector; and
   e) an additional dielectric layer adjacent to the modulating layer on a p-side, wherein the additional dielectric layer comprises a material selected from the group consisting of AlO, and GaAlO.

28. The wavelength division multiplexing system of claim 1, wherein at least one of the wavelength tunable resonant photodetectors comprises a wavelength tunable semiconductor vertical cavity resonance photodetector comprising:
   a) a substrate comprising a material selected from the group consisting of:
      i) GaAs;
      ii) GaAlAs alloy; and
      iii) another semiconductor material lattice matched or nearly lattice matched to GaAs;
   b) a bottom mirror located above the substrate and formed by a Bragg reflector region;
   c) a cavity comprising:
      i) a photodetecting element located above the bottom mirror, comprising:
         A) a light absorption layer that generates photocurrent when light is absorbed;
         B) a first n-doped current spreading region located above the substrate and below the light absorption layer;
         C) a first p-doped current spreading region located above the light absorption layer;
         D) current apertures placed between each neighboring region; and
         E) a photodetecting element bias control device located between the n-doped current spreading region and the p-doped current spreading region, such that no photocurrent occurs when no light is absorbed; and
      ii) a phase control element located above the photodetecting element, comprising:
         A) a modulating layer located above the first p-doped current spreading region, wherein the modulating layer uses a position-dependent electro-optical effect to modulate a resonant wavelength of the cavity when exposed either to an electric field when a reverse bias is applied, or to an injection current when a forward bias is applied;
         B) a second n-doped current spreading region located above the modulating layer;
         C) current apertures placed between each neighboring region; and
         D) a phase control element bias control device located between the second n-doped current spreading region and the first p-doped current spreading region, such that an electrical field is created to cause the modulating layer to modulate the resonance wavelength of the cavity;
   d) a top mirror located above the phase control element and formed by a Bragg reflector; and
   e) two additional dielectric layers sandwiching the modulating layer, wherein each of the additional dielectric layers comprises a material selected from the group consisting of AlO, and GaAlO.

29. The wavelength division multiplexing system of claim 1, wherein at least one of the wavelength tunable lasers comprises a wavelength tunable semiconductor vertical cavity surface emitting laser comprising:
   a) a substrate;
   b) a bottom mirror located above the substrate and formed by a Bragg reflector region;
   c) a cavity comprising:
      i) an active element located above the bottom mirror; and
      ii) a phase control element located above the active element; and
   d) a top mirror located above the phase control element and formed by a Bragg reflector.

30. The wavelength division multiplexing system of claim 29, wherein the active element of the wavelength tunable semiconductor vertical cavity surface emitting laser comprises:
   a) a light generating layer that emits light when exposed to an injection current when a forward bias is applied;
   b) a first n-doped current spreading region located above the substrate and below the light generating layer;

c) a first p-doped current spreading region located above the light generating layer;
d) current apertures placed between each neighboring region; and
e) an active element bias control device located between the n-doped current spreading region and the p-doped current spreading region such that current can be injected into the light generating layer to generate light.

31. The wavelength division multiplexing system of claim 30, wherein the phase control element of the wavelength tunable semiconductor vertical cavity surface emitting laser comprises:
a) a modulating layer located above the first p-doped current spreading region, wherein the modulating layer uses a position-dependent electro-optical effect to modulate a wavelength of light when exposed either to an electric field when a reverse bias is applied, or to an injection current when a forward bias is applied;
b) a second n-doped current spreading region located above the modulating layer;
c) current apertures placed between each neighboring region; and
d) a phase control element bias control device located between the second n-doped current spreading region and the first p-doped current spreading region such that an electrical field is created and causes the modulating layer to modulate the wavelength of light.

32. The wavelength division multiplexing system of claim 29, wherein the substrate of the wavelength tunable semiconductor vertical cavity laser comprises a material selected from the group consisting of:
a) GaAs;
b) GaAlAs alloy; and
c) another semiconductor material lattice matched or nearly lattice matched to GaAs.

33. The wavelength division multiplexing system claim 32, wherein the wavelength tunable vertical cavity surface emitting laser further comprises an additional dielectric layer adjacent to the modulating layer, wherein the additional dielectric layer comprises a material selected from the group consisting of:
a) AlO; and
b) GaAlO.

34. The wavelength division multiplexing system of claim 33, wherein the additional dielectric layer is adjacent to the modulating layer of the wavelength tunable vertical cavity surface emitting laser on an n-side.

35. The wavelength division multiplexing system of claim 33, wherein the additional dielectric layer is adjacent to the modulating layer of the wavelength tunable vertical cavity surface emitting laser on a p-side.

36. The wavelength division multiplexing system of claim 32, wherein the modulating layer of the wavelength tunable vertical cavity surface emitting laser is sandwiched between two additional dielectric layers, wherein each of the additional dielectric layers comprises a material selected from the group consisting of:
a) AlO; and
b) GaAlO.

37. The wavelength division multiplexing system of claim 1, wherein at least one of the wavelength tunable lasers comprises a semiconductor wavelength tunable tilted cavity laser, comprising a modulating element which uses a position-dependent electro-optical effect to modulate a wavelength of emitted laser light.

38. The wavelength division multiplexing system of claim 37, wherein the semiconductor wavelength tunable tilted cavity laser further comprises a substrate selected from the group consisting of:
a) GaAs;
b) GaAlAs alloy; and
c) another semiconductor material lattice matched or nearly lattice matched to GaAs.

39. The wavelength division multiplexing system of claim 38, wherein the wavelength tunable tilted cavity laser further comprises an additional dielectric layer adjacent to the modulating element, wherein the additional dielectric layer comprises a material selected from the group consisting of:
a) AlO; and
b) GaAlO.

40. The wavelength division multiplexing system of claim 39, wherein the additional dielectric layer is adjacent to the modulating element on an n-side.

41. The wavelength division multiplexing system of claim 39, wherein the additional dielectric layer is adjacent to the modulating element on a p-side.

42. The wavelength division multiplexing system of claim 38, wherein the wavelength tunable tilted cavity laser further comprises two additional dielectric layers sandwiching the modulating element, wherein each of the additional dielectric layers comprises a material selected from the group consisting of:
a) AlO; and
b) GaAlO.

43. The wavelength division multiplexing system of claim 1, wherein at least one of the wavelength tunable resonant photodetectors is a semiconductor wavelength tunable tilted cavity resonant photodetector, comprising a modulating element using a position-dependent electro-optical effect to modulate a resonance wavelength of the tilted cavity resonant photodetector.

44. The wavelength division multiplexing system of claim 43, wherein the wavelength tunable semiconductor tilted cavity resonant photodetector further comprises a substrate selected from the group consisting of:
a) GaAs;
b) GaAlAs alloy; and
c) another semiconductor material lattice matched or nearly lattice matched to GaAs.

45. The wavelength division multiplexing system claim 44, wherein the semiconductor wavelength tunable tilted cavity resonant photodetector further comprises an additional dielectric layer adjacent to the modulating element, wherein the additional dielectric layer comprises a material selected from the group consisting of:
a) AlO; and
b) GaAlO.

46. The wavelength division multiplexing system of claim 45, wherein the additional dielectric layer is adjacent to the modulating element on an n-side.

47. The wavelength division multiplexing system of claim 45, wherein the additional dielectric layer is adjacent to the modulating element on a p-side.

48. The wavelength division multiplexing system of claim 44, wherein the semiconductor wavelength tunable tilted cavity resonant photodetector further comprises two additional dielectric layers sandwiching the modulating element, wherein each of the additional dielectric layers comprises a material selected from the group consisting of:
a) AlO; and
b) GaAlO.

49. The wavelength division multiplexing system of claim 1, wherein at least one of the wavelength tunable lasers comprises a wavelength tunable edge-emitting laser, comprising a modulating element using a position-dependent electro-optical effect.

50. The wavelength division multiplexing system of claim 49, wherein the wavelength tunable edge-emitting laser further comprises a section using a distributed feedback to select a single longitudinal mode.

51. The wavelength division multiplexing system of claim 1, wherein at least one of the wavelength tunable resonant photodetectors comprises a photodetector operating in the edge geometry and comprises a modulating element using a position-dependent electro-optical effect.

52. The wavelength division multiplexing system of claim 51, wherein the wavelength tunable resonant photodetector comprises a section using a distributed feedback to select a resonant wavelength of the photodetector.

53. A method of self-adjusting a wavelength division multiplexing system comprising at least two arrays of optoelectronic devices, each being located at a different location, and a communication medium, wherein a first array of optoelectronic devices is located at a first location and comprises at least one reference wavelength tunable laser and at least one data communication wavelength tunable laser; and wherein a second array of optoelectronic devices is located at a second location, different from the first location, and comprises at least one reference wavelength tunable resonance photodetector and at least one data communication wavelength tunable resonance photodetector, comprising the steps of:
 a) setting a plurality of initial settings; and
 b) adjusting the settings in situ.

54. The method of claim 53, wherein step a) comprises the substeps of:
 i) calibrating a wavelength of light emitted by the reference wavelength tunable laser as a function of a control parameter controlling the wavelength of the emitted laser light;
 ii) calibrating a resonance wavelength of the reference wavelength tunable resonant photodetector as a function of a control parameter controlling the resonance wavelength of resonant photodetectors;
 iii) setting the wavelength of the emitted laser light of the reference wavelength tunable laser to a predefined value; and
 iv) setting the resonant wavelength of the reference wavelength tunable resonant photodetector equal to the set wavelength emitted by the reference wavelength tunable laser.

55. The method of claim 54, wherein step a) further comprises the substeps of:
 v) calibrating a wavelength of light emitted by the data communication wavelength tunable laser as a function of a control parameter controlling the wavelength of the emitted laser light;
 vi) calibrating a resonance wavelength of the data communication wavelength tunable resonant photodetector as a function of a control parameter controlling the resonance wavelength of resonant photodetectors;
 vii) setting the wavelength of the emitted laser light of the data communication wavelength tunable laser to a predefined value; and
 viii) setting the resonant wavelength of the data communication wavelength tunable resonant photodetector equal to the set wavelength emitted by the data communication wavelength tunable laser.

56. The method of claim 55, wherein substeps v) through viii) are carried out for all data communication wavelength tunable lasers of the first array of optoelectronic devices.

57. The method of claim 55, wherein step a) further comprises the substeps of:
 ix) placing the first array of optoelectronic devices at the first location; and
 x) placing the second array of optoelectronic devices at the second location.

58. The method of claim 53, wherein step b) comprises the substeps of:
 i) scanning a resonant wavelength of the reference wavelength tunable resonant photodetector until a detected signal reaches a maximum value; and
 ii) shifting a resonant wavelength of the reference wavelength tunable resonant photodetector such that the signal detected by the reference wavelength tunable resonance photodetector has a maximum value.

59. The method of claim 58, wherein step b) further comprises the substep of:
 iii) shifting a resonance wavelength of the data communication wavelength tunable resonant photodetector by a same value as the reference wavelength tunable resonant photodetector has been shifted.

60. The method of claim 59, wherein substep iii) is carried out for all data communication wavelength tunable resonant photodetectors of the second array of optoelectronic devices.

61. A method of in situ adjustment of a wavelength division multiplexing system comprising at least two arrays of optoelectronic devices, each being located at a different location, and a communication medium, wherein a first array of optoelectronic devices is located at a first location and comprises a plurality of data communication wavelength tunable lasers; and wherein a second array of optoelectronic devices is located at a second location, different from the first location, and comprises a plurality of data communication wavelength tunable resonance photodetectors, wherein the data communication wavelength tunable lasers and the data communication wavelength tunable resonant photodetectors form at least one data communication channel, and wherein a signal transferred in at least one data communication channel comprises a reference part, and a data communication part, the method comprising the steps of:
 a) scanning a resonant wavelength of a wavelength tunable resonant photodetector operating in the data communication channel until the signal detected by the wavelength tunable resonant photodetector corresponding to a reference part of the signal reaches a maximum value;
 b) fixing a resonance wavelength of the wavelength tunable resonant photodetector; and
 c) detecting a data communication signal at a fixed resonant wavelength.

62. A method of in situ adjustment of the wavelength division multiplexing system comprising at least two arrays of optoelectronic devices, each being located at a different location, and a communication medium, wherein a first array of optoelectronic devices is located at a first location and comprises at least one wavelength tunable laser, and at least one wavelength tunable resonant photodetector; and the second array of optoelectronic devices comprises at least one wavelength tunable laser, and at least one wavelength tunable resonant photodetector; and at least one dialog data communication channel, wherein the dialog data communication channel comprises a wavelength tunable laser in the first array of optoelectronic devices, a wavelength tunable resonant photodetector in the first array of optoelectronic devices, a wavelength tunable laser in the second array of optoelectronic devices, and a wavelength tunable resonant photodetector in the second array of optoelectronic devices, the method comprising the steps of:
a) transmitting a first signal in the dialog data communication channel from the wavelength tunable laser of the first array of optoelectronic devices;
b) detecting an intensity of the first signal by the wavelength tunable resonant photodetector of the second array of optoelectronic devices;
c) transmitting a second signal in the dialog data communication channel from the wavelength tunable laser of the second array of optoelectronic devices such that the second signal transfers information about an intensity of the first signal;
d) detecting a second signal by the wavelength tunable resonant photodetector of the first array of optoelectronic devices such that the information about the intensity of the first signal is detected; and
e) tuning the wavelength of the wavelength tunable laser of the first array of optoelectronic devices until the intensity of the first signal reaches a maximum value.

* * * * *

UNITED STATES PATENT AND TRADEMARK OFFICE
CERTIFICATE OF CORRECTION

PATENT NO. : 7,075,954 B2  Page 1 of 1
APPLICATION NO. : 10/455186
DATED : July 11, 2006
INVENTOR(S) : Ledentsov et al.

It is certified that error appears in the above-identified patent and that said Letters Patent is hereby corrected as shown below:

Column 29:

Line 37, replace the words "system claim" with the words "system of claim"

Column 30:

Line 46, replace the words "system claim" with the words "system of claim"

Signed and Sealed this

Fifth Day of September, 2006

JON W. DUDAS
*Director of the United States Patent and Trademark Office*